(12) United States Patent
Zheng et al.

(10) Patent No.: US 9,847,132 B1
(45) Date of Patent: Dec. 19, 2017

(54) TERNARY CONTENT ADDRESSABLE MEMORIES

(71) Applicant: HEWLETT PACKARD ENTERPRISE DEVELOPMENT LP, Houston, TX (US)

(72) Inventors: Le Zheng, Palo Alto, CA (US); Brent Buchanan, Palo Alto, CA (US); John Paul Strachan, Palo Alto, CA (US)

(73) Assignee: Hewlett Packard Enterprise Development LP, Houston, TX (US)

(*) Notice: Subject to any disclaimer, the term of this patent is extended or adjusted under 35 U.S.C. 154(b) by 0 days.

(21) Appl. No.: 15/222,234

(22) Filed: Jul. 28, 2016

(51) Int. Cl.
*G11C 15/00* (2006.01)
*G11C 15/04* (2006.01)

(52) U.S. Cl.
CPC ................... *G11C 15/046* (2013.01)

(58) Field of Classification Search
CPC ........ G11C 15/04; G11C 15/00; G11C 15/046
USPC .............................. 365/47.17, 49.1
See application file for complete search history.

(56) References Cited

U.S. PATENT DOCUMENTS

| | | | |
|---|---|---|---|
| 9,230,649 B2 | 1/2016 | Chang et al. | |
| 9,502,114 B1* | 11/2016 | Lin | G11C 15/046 |
| 2013/0054886 A1 | 2/2013 | Eshraghian et al. | |

OTHER PUBLICATIONS

Li-Yue Huang et al., "ReRAM-Based 4T2R Nonvolatile TCAM with 7xNVM-Stress Reduction, and 4x Improvement in Speed-WordLength-Capacity for Normally-Off Instant-On Filter-Based Search Engines Used in Big-Data Processing," 2014 Symposium on VLSI Circuits Digest of Technical Papers, 2014, pp. 1-2, IEEE.
Nilesh Mishra and Harish M. Kittur, "4-Transistors of Dynamic Memristor Based TCAM," IJERA'2012, May-Jun. 2012, pp. 2520-2524, vol. 2, Issue 3.
Pilin Junsangsri and Fabrizio Lombardi, "A Memristor-Based TCAM (Ternary Content Addressable Memory) Cell: Design and Evaluation," GLSVLSI'12, May 3-4, 2012, Salt Lake City, Utah, USA, 2012, pp. 311-314, ACM.

\* cited by examiner

*Primary Examiner* — Huan Hoang
(74) *Attorney, Agent, or Firm* — Hewlett Packard Enterprise Patent Department

(57) ABSTRACT

An example ternary content addressable memory. A bit cell of the memory may include first and second memristors, with a first terminal of the first memristor being connected to a first terminal of the second memristor via a node, a second terminal of the first memristor being switchably connected to a first data line, and a second terminal of the second memristor being switchably connected to a second data line. The bit cell may also include a match-line transistor that is connected between a first rail and a match line, with a gate of the match-line transistor being connected to the node.

20 Claims, 6 Drawing Sheets

Fig. 2

| Stored Value | $M_1$ | $M_2$ |
|---|---|---|
| 0 | Low | High |
| 1 | High | Low |
| X (wildcard) | High | High |
| | Low | Low |

Fig. 3

| Search Criteria | Stored Value | Result |
|---|---|---|
| 0 | 0 | Match |
| 0 | 1 | *Miss* |
| 0 | X | Match |
| 1 | 0 | *Miss* |
| 1 | 1 | Match |
| 1 | X | Match |
| Y (wildcard) | Any | Match |

Fig. 4

| Operation | WL | SL | $\overline{SL}$ | SX | ND | NS | ML |
|---|---|---|---|---|---|---|---|
| $M_1 \rightarrow$ LRS | $V_{DD}$ | $V_{set}$ | - | $V_{DD}$ | GND | - | - |
| $M_2 \rightarrow$ LRS | $V_{DD}$ | - | $V_{set}$ | $V_{DD}$ | GND | - | - |
| $M_1$ & $M_2 \rightarrow$ LRS | $V_{DD}$ | $V_{set}$ | $V_{set}$ | $V_{DD}$ | GND | - | - |
| $M_1 \rightarrow$ HRS | $V_{DD}$ | GND | - | $V_{DD}$ | $V_{reset}$ | - | - |
| $M_2 \rightarrow$ HRS | $V_{DD}$ | - | GND | $V_{DD}$ | $V_{reset}$ | - | - |
| $M_1$ & $M_2 \rightarrow$ HRS | $V_{DD}$ | GND | GND | $V_{DD}$ | $V_{reset}$ | - | - |
| Read $M_1$ | $V_{DD}$ | GND | - | $V_{DD}$ | $V_{read}$ | - | - |
| | $V_{DD}$ | $V_{read}$ | - | $V_{DD}$ | GND | - | - |
| Read $M_2$ | $V_{DD}$ | - | GND | $V_{DD}$ | $V_{read}$ | - | - |
| | $V_{DD}$ | - | $V_{read}$ | $V_{DD}$ | GND | - | - |
| Read $M_1$ & $M_2$ | $V_{DD}$ | GND | GND | $V_{DD}$ | $V_{read}$ | - | - |
| | $V_{DD}$ | $V_{read}$ | $V_{read}$ | $V_{DD}$ | GND | - | - |

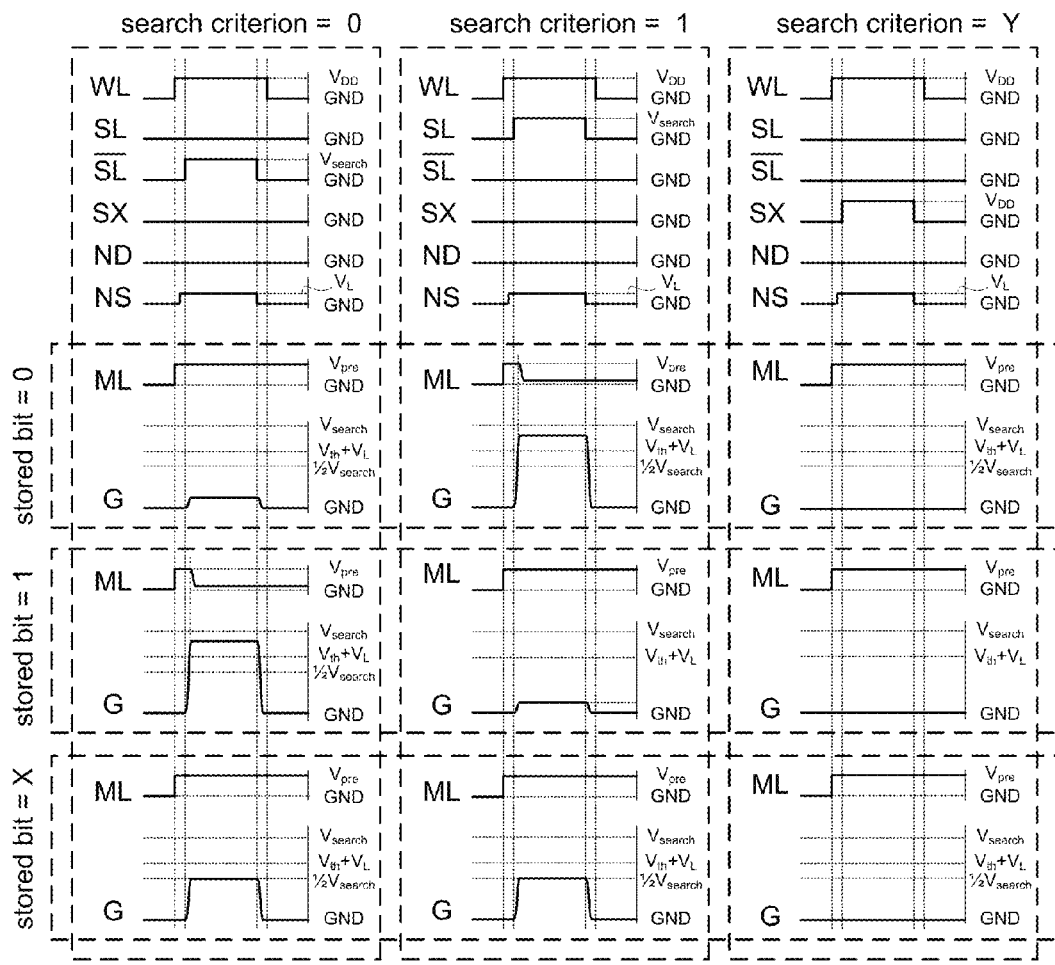

TERNARY CONTENT ADDRESSABLE MEMORIES

BACKGROUND

Content addressable memory (CAM) is a type of memory that can perform a search operation in which a data string may be input as search content and the resulting output is an address of a location in the memory that stores matching data (if there is any). This is in contrast to a read operation in which an address is input and the resulting output is the data stored in the memory location corresponding to the searched address. Certain CAMs may be able to perform both the aforementioned search operation and the aforementioned read operation, while non-CAM memories may be able to perform the read operation but not the search operation.

Ternary content addressable memory (TCAM) is a type of CAM in which the bit cells can store a wildcard data value in addition to two binary data values. When a bit cell that stores the wildcard value is searched, the result is a match regardless of what search criterion is used to search the bit cell. Certain TCAMs may also allow a search to be conducted on the basis of a wildcard search criterion. When a bit cell is searched based on the wildcard search criterion, the result is a match regardless of what value is stored in the bit cell.

BRIEF DESCRIPTION OF THE DRAWINGS

FIG. 2 is a table illustrating an association between resistance states and stored values.

FIG. 3 is a table illustrating search results for combinations of search criteria and stored value.

FIG. 4 is a table illustrating voltages that are applied to wiring lines of an example TCAM to perform writing and reading operations.

FIG. 5A is a table illustrating voltages that are applied to wiring lines of an example TCAM to perform search operations.

FIG. 5B is a signal diagram illustrating voltages that are applied to wiring lines of an example TCAM to perform search operations, as well as the states of an example bit cell resulting from such search operations for each combination of search criterion and stored value.

DETAILED DESCRIPTION

Figure 1A:
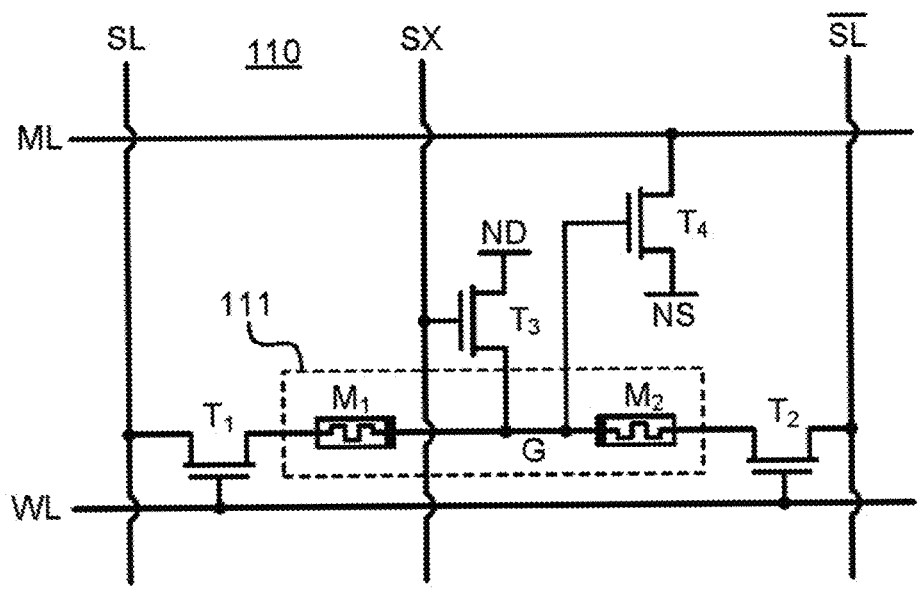
FIG. 1A is circuit diagram illustrating an example bit cell of an example TCAM.

Described herein are example TCAMs that include memristors as storage elements. Also described herein are example devices that may have a TCAM as a component thereof, as well as example methods of operating TCAMs.

[Example TCAMs—Overview]

The example TCAMs described herein may include memristors as storage elements. The use of memristors as storage elements, as opposed to using, for example, SRAMs or DRAMs, allows the example TCAMs disclosed herein to be non-volatile memory devices. In addition, as a result of using memristor-based storage elements, the example TCAMs disclosed herein may have higher storage densities and lower power consumption than comparable TCAMs that use SRAMs or DRAMs as storage elements.

The example TCAMs disclosed herein may be capable of storing three values including a wildcard value. Certain of the example TCAMs disclosed herein may also be capable of being searched on the basis of three search criteria including a wildcard search criterion. Thus, the example TCAMs disclosed herein may provide greater flexibility and speed in search operations as compared to CAMs that store just two values or CAMs/TCAMs that are searchable on the basis of just two search criteria.

Furthermore, the example TCAMs disclosed herein may have bit cell circuit layouts that can fit in a smaller layout space than other TCAM bit cell layouts, which may allow the example TCAMs to have a more densely packed memory array (i.e., more bit cells per unit area) than other comparable TCAMs. In certain examples, such savings of bit cell layout space might be achieved, for example, as a result of the bit cell circuit layout allowing for the use of just four FETs per bit cell instead of the five or more FETs per bit cell that may be required in other circuit layouts in order to provide TCAM functionality. As another example of how such savings of bit cell layout space might be achieved, in certain of the example TCAMs disclosed herein all of the transistors in the bit cells of the TCAM may be a same channel type as one another (for example, all NFETs), this may allow for a well to be omitted from the bit cell array that might otherwise be needed, thus freeing up layout space that would have been used for the well. In addition to saving layout space, the use of transistors having all the same channel type may also decrease the complexity and/or cost of manufacturing the TCAM.

In particular, in certain example TCAMs disclosed herein, a bit cell may include two memristors, three switching transistors, and a match-line transistor. A first switching transistor, a first memristor, a second memristor, and a second switching transistor may be connected in series between a first data line and a second data line. The match-line transistor may be connected between a match-line and a first rail. A gate of the match-line transistor may be connected to a common node of the two memristors. A third switching transistor may be connected between the node and a second rail.

The bit cell may store three values by changing resistance states of the two memristors. A first combination of resistance states of the two memristors may correspond to a 0 value, a second combination of resistance states may correspond to a 1 value, and a third combination of resistance states may corresponds to an X (wildcard) value.

Furthermore, certain of the example TCAMs may also include control circuitry that searches the bit cell based on a first search criterion (e.g., 0), based on a second search criterion (e.g., 1), and based on a wildcard search criterion. If the bit cell stores a value that does not match the search criterion, the voltage of the common node during the search may become a voltage that turns on the match-line transistor, thereby connecting the match line to the rail and resulting in a voltage of the match line (which has been pre-charged) being pulled down below its pre-charged voltage. If the bit cell stores a value matching the search criterion, then the voltage of the common node may become a voltage that keeps the match-line transistor off so that the voltage of the match-line is not pulled down (at least not by that bit cell—it might be pulled down by some other bit cell). Thus, matches or misses of the search criterion may be determined by monitoring the match line and determining whether or not its voltage is pulled low.

The control circuitry may search the bit cell based on the first search criterion by pre-charging the match line, applying a first voltage to the first data line, and applying a ground voltage to the second data line. The control circuitry may search the bit cell based on a second search criterion by pre-charging the match line, applying the ground voltage to the first data line, and applying the first voltage to the second data line. The control circuitry may search the bit cell based on the wildcard search criterion by applying a ground voltage to both the first and second data lines.

The two memristors of the bit cell may form a resistive divider. An output voltage of the resistive divider (i.e., the voltage of the common node between the two memristors) is applied to the gate of the match-line transistor, and thus the output voltage of the resistive divider may control whether the match-line transistor is on or off. The relative resistances of the two memristors and the voltages that are applied to the bit cell during a search operation may be set such that the output voltage of the resistive divider during the search operation is an off-voltage (low voltage) when the memristors store a value that matches the search criterion and an on-voltage (high voltage) when the memristors store a value that matches the search criterion. When the search criterion is the wildcard search criterion, the output voltage of the resistive divider is low regardless of what value is stored in the memristors.

Certain example TCAMs may include multiple instances of the example bit cells described above, which may be arrayed in rows and columns. In certain examples, each first and second data line may correspond to a column and may be connected to each bit cell in their corresponding column, and each word line may correspond to a row and be connected to each bit cell in their corresponding row. Each match line may correspond to a row and be connected to multiple bit cells that are in their corresponding row, with the number of bit cells per match line being equal to a search unit size for the TCAM (i.e., a word size) and the bit cells that are connected to the same match line as one another forming a word storage block. The bit cells of the word storage block may be searched to see if the data stored therein matches an input search word. The match line for a given word storage block may be pulled low if any one of the bit cells thereof misses its respective search criterion, and therefore it can be determined whether the given word storage block stores data that matches the search word by monitoring whether the corresponding match line is pulled low. Each row may include a single word storage block (in which case there may be one word line per row), or each row may include P>1 word storage blocks (in which case there may be P word lines per row).

[Bit Cells—Detailed Examples]

FIG. 1A illustrates an example bit cell 110 of an example TCAM 100. The example bit cell 110 may include a first memristor $M_1$, a second memristor $M_2$, a first switching transistor $T_1$, a second switching transistor $T_2$, a third switching transistor $T_3$, and a match-line transistor $T_4$. The first switching transistor $T_1$, the first memristor $M_1$, the second memristor $M_2$, and the second switching transistor $T_2$ may be connected in series between a first data line SL and a second data line $\overline{SL}$. Thus, the first memristor $M_1$ may be switchably connected to the first data line SL via the first switching transistor $T_1$, and the second memristor $M_2$ may be switchably connected to the second data line $\overline{SL}$ via the second switching transistor $T_2$. The first memristor $M_1$ and the second memristor $M_2$ may be connected to each other via common node, namely the node G. The match-line transistor $T_4$ may be connected between a first rail NS and a match line ML. The third switching transistor $T_3$ may be connected between the node G and a second rail ND. Thus, the node G may be switchably connected to the second rail ND via the third switching transistor $T_3$.

Gates of the first and second switching transistors $T_1$ and $T_2$ may be connected to a word line WL, and therefore a voltage of the word line WL may control conductive states of the first and second switching transistors $T_1$ and $T_2$. A gate of the third switching transistor $T_3$ may be connected to a third data line SX, and therefore a voltage of the third data line SX controls a conductive state of the third switching transistor $T_3$. A gate of the match-line transistor $T_4$ may be connected to the node G, and therefore a voltage of the node G may control a conductive state of the match-line transistor $T_4$.

The first and second memristors $M_1$ and $M_2$ may serve as the storage element of the bit cell 110. A memristor (such as the first and second memristors $M_1$ and $M_2$) may be a device whose resistance can be changed between multiple resistance states by applying certain voltage differences across it or flowing certain currents through it, with the device "remembering" or maintaining its most recent resistance state even when the voltage/current that caused it to enter that state has been removed. In other words, the current resistance state of a memristor may depend on the magnitude and polarity of voltage differences that have been applied across it in the past or on how much current has flowed in what direction through it in the past.

In particular, the memristors $M_1$ and $M_2$ may each be capable of changing between a low resistance state in which it exhibits relatively low resistance and a high resistance state in which it exhibits relatively high resistance. For each of the memristors $M_1$ and $M_2$, the respective memristor may be caused to enter the low resistance state by applying a setting voltage difference of sufficient magnitude across the memristor with a certain polarity, and the respective memristor may be caused to change to the high resistance state by applying a resetting voltage difference of sufficient magnitude across the memristor M with an opposite polarity.

The polarities with which the setting/resetting voltage differences may be applied to the memristors $M_1$ and $M_2$ in order to perform setting and resetting are indicated in FIG. 1 by a black band on one end of the symbol for the memristor. In particular, in order to set the memristor $M_1$ or $M_2$ to the low resistance state, the setting voltage difference should be applied across the memristor $M_1$ or $M_2$ such that a lower voltage is applied to the end of the memristor $M_1$ or $M_2$ that has the black band than is applied to the other end of the memristor $M_1$ or $M_2$. Conversely, in order to reset the memristor $M_1$ or $M_2$ to the high resistance state, the resetting voltage difference should be applied across the memristor $M_1$ or $M_2$ such that a higher voltage is applied to the end of the memristor $M_1$ or $M_2$ that has the black band.

Once the memristor $M_1$ or $M_2$ is set or reset, it will tend to stay in its current resistance state until it is reset or set again. Moreover, the first and second memristors $M_1$ and $M_2$ in the example bit cell 110 may be set or reset independently from one another. As a result, the combination of resistance states of the first and second memristors $M_1$ and $M_2$ may be used to store data values. For example, resistance states and stored values may be associated with one another as illustrated in the table of FIG. 2. Specifically, a first digital value (such as 0) may be stored by setting the first memristor $M_1$ to the low resistance state and resetting the second memristor $M_2$ to the high resistance state; a second digital value (such as 1) may be stored by resetting the first memristor $M_1$ to the high resistance state and setting the second memristor $M_2$ to the low resistance state; and a wildcard value may be stored by causing the first and second memristors $M_1$ and $M_2$ to have the same resistance state as one another (i.e., either both have the high resistance state or both have the low resistance state).

[Example Write and Read Operations—Individual Bit Cell]

The first and second memristors $M_1$ and $M_2$ may be set or reset by applying voltages to the various wiring lines as illustrated in FIG. 4. In the table illustrated in FIG. 4, rows correspond to operations and columns correspond to wiring lines, with each cell specifying a voltage that is to be applied to the corresponding wiring line during performance of the corresponding operation. When a given operation has more than one row associated therewith (see, for example, the operation "Read $M_1$"), each of the rows indicates an alternative way to perform the operation. Note that the absence of multiple rows in the Figure for a particular operation does not necessarily mean that there are no alternative ways to perform the operation.

In the table illustrated in FIG. 4, a dash ("-") indicates that the voltage of the corresponding wiring line during the corresponding operation is not directly relevant to that particular operation; thus, the voltage of such a wiring line during the operation may be set based on other considerations. For example, if multiple operations are being performed simultaneously, a wiring line whose voltage is not specified as part of one operation (indicated by a dash in the table) may have its voltage specified as part of the other operation being performed. In particular, it may be possible for two operations to be performed simultaneously if they do not specify different voltages to be applied to the same wiring line at the same time. For example, the operation of setting $M_1$ to the low resistance state ("$M_1 \rightarrow$LRS") and the operation of setting $M_2$ to the low resistance state ("$M_2 \rightarrow$LRS") could be performed simultaneously without conflict, since $M_1 \rightarrow$LRS specifies a particular voltage for SL while $M_2 \rightarrow$LRS does not, $M_2 \rightarrow$LRS specifies a particular voltage for $\overline{SL}$ while $M_1 \rightarrow$LRS does not, and although $M_1 \rightarrow$LRS and $M_2 \rightarrow$LRS both specify particular voltages for ML, SX, and ND, they specify the same voltages for these wiring lines. In some examples, if no operations that are currently being performed specify a voltage for a particular wiring line, then the wiring line may be floated. Floating certain wiring lines whose voltage is not specified during an operation may be advantageous in certain contexts because it may prevent current from flowing through certain circuit components, and may also reduce power usage. In some examples, if no operations that are currently being performed specify a voltage for a particular wiring line, then the ground voltage GND may be applied to that wiring line. Applying GND to certain wiring lines whose voltage is not specified during an operation may be advantageous in certain contexts because it may hold certain circuit components that are not being used in the operation in an OFF state.

In particular, the first memristor $M_1$ may be set to the low resistance state by turning on the first and third transistors $T_1$ and $T_3$, applying a setting voltage $V_{set}$ to the first data line SL, and applying a ground voltage GND to the second rail ND. This causes the setting voltage difference to be applied across the memristor $M_1$ with a first polarity (i.e., left-to-right), as $V_{set}$ is applied to a left side of the memristor $M_1$ via the transistor $T_1$ and GND is applied to the right side of the memristor $M_1$ via the node G. Because turning on the first transistor $T_1$ also results in turning on the second transistor $T_2$ (thereby connecting the second memristor $M_2$ to the second data line $\overline{SL}$), if it is desired to prevent a voltage difference from be applied across the memristor $M_2$ while the first memristor $M_1$ is being set, the second data line $\overline{SL}$ may be floated.

Similarly, the second memristor $M_2$ may be set to the low resistance state by turning on the second and third transistors $T_2$ and $T_3$, applying the setting voltage $V_{set}$ to the second data line $\overline{SL}$, and applying the ground voltage GND to the second rail ND. This causes the setting voltage difference to be applied across the memristor $M_2$ with a second polarity (i.e., right-to-left), as $V_{set}$ is applied to the right side of the memristor $M_2$ via the transistor $T_2$ and GND is applied to the left side of the memristor $M_2$ via the node G. Because turning on the second transistor $T_2$ also results in turning on the first transistor $T_1$ (thereby connecting the first memristor $M_1$ to the first data line SL), if it is desired to prevent a voltage difference from be applied across the memristor $M_1$ while the second memristor $M_2$ is being set, the ground voltage GND may be applied to the first data line SL.

In certain examples, the memristors $M_1$ and $M_2$ may be set simultaneously by applying $V_{DD}$ to the word line WL and to the third data line SX, applying $V_{set}$ to both the first and second data lines SL/$\overline{SL}$, and applying GND to the second rail ND. This causes the setting voltage difference to be applied across the memristor $M_1$ with a first polarity (i.e., left-to-right), and the setting voltage difference to be applied across the memristor $M_2$ with a second polarity (i.e., right-to-left).

The first memristor $M_1$ may be reset to the high resistance state by turning on the first and third transistors $T_1$ and $T_3$, applying the ground voltage GND to the first data line SL, and applying a resetting voltage $V_{reset}$ to the second rail ND. This causes the resetting voltage difference to be applied across the memristor $M_1$ with the second polarity (i.e., right-to-left), as $V_{reset}$ is applied to the right side of the memristor $M_1$ via the node G and GND is applied to the left side of the memristor $M_1$ via the first transistor $T_1$. Because turning on the first transistor $T_1$ also results in turning on the second transistor $T_2$ (thereby connecting the second memristor $M_2$ to the second data line $\overline{SL}$), if it is desired to prevent a voltage difference from be applied across the memristor $M_2$ while the first memristor $M_1$ is being reset, the resetting voltage $V_{reset}$ may be applied to the second data line $\overline{SL}$.

The second memristor $M_2$ may be reset to the high resistance state by turning on the second and third transistors $T_2$ and $T_3$, applying the ground voltage GND to the second data line $\overline{SL}$, and applying to the resetting voltage $V_{reset}$ to the second rail ND. This causes the resetting voltage difference to be applied across the memristor $M_2$ with the first polarity (i.e., left-to-right), as $V_{reset}$ is applied to the left side of the memristor $M_2$ via the node G and GND is applied to the right side of the memristor $M_2$ via the second transistor $T_2$. Because turning on the second transistor $T_2$ also results in turning on the first transistor $T_1$ (thereby connecting the first memristor $M_1$ to the first data line SL), if it is desired to prevent a voltage difference from be applied across the memristor $M_1$ while the second memristor $M_2$ is being set, the resetting voltage $V_{reset}$ may be applied to the first data line SL.

In certain examples, the memristors $M_1$ and $M_2$ may be reset simultaneously by applying $V_{DD}$ to the word line WL and to the third data line SX, applying GND to both the first and second data lines SL/$\overline{SL}$, and applying $V_{reset}$ to the second rail ND. This causes the resetting voltage difference to be applied across the memristor $M_2$ with a first polarity (i.e., left-to-right), and the resetting voltage difference to be applied across the memristor $M_1$ with a second polarity (i.e., right-to-left).

Although the description above refers to the voltages $V_{set}$, $V_{reset}$, and GND appearing on the input terminals of the memristors $M_1$ or $M_2$ during setting and resetting operations, it should be understood that in practice the voltages that actually appear on these nodes will differ slightly from the voltages $V_{set}$, $V_{reset}$, and GND that are carried on the wiring lines SL, $\overline{SL}$, and ND during these operations, due to the fact that the transistors $T_1$, $T_2$, and $T_3$ all have some finite resistance when turned on. In particular, assuming the channel resistances of the transistors $T_1$, $T_2$, and $T_3$ are all the same, then during a setting operation the voltage appearing on the node G may be equal to $V_{set}/\alpha$ and the voltage appearing on the other input terminal of the memristor $M_1$ or $M_2$ may be equal to $V_{set} \cdot (1-1/\alpha)$, where a depends on the resistance of the memristor $M_1$ and $M_2$ and the channel resistance of the transistors $T_1$, $T_2$, and $T_3$. Similarly, during the resetting operation the voltage appearing on the node G may be equal to $V_{reset} \cdot (1-1/\alpha)$ and the voltage appearing on the other input terminal of the memristor $M_1$ or $M_2$ may be equal to $V_{reset}/\alpha$. If $R_M$ is a resistance of the memristor $M_1$ or $M_2$ and $R_T$ is the resistance of the transistors $T_1$, $T_2$, and $T_3$, then $$\alpha = 2 + \frac{R_M}{R_T}.$$

Note that $R_M$ may vary throughout the setting/resetting operation, and therefore $\alpha$ may vary as well. A smallest value of $\alpha$ ($\alpha_{min}$) occurs when $R_M$ is at its minimum $\alpha$ ($\alpha_{min}$) and a largest value of $\alpha$ ($\alpha_{max}$) occurs when $R_M$ is at its maximum; that is, $$\alpha_{min} = 2 + \frac{R_{LRS}}{R_T}$$

and $$\alpha_{max} = 2 + \frac{R_{HRS}}{R_T}$$

where $R_{LRS}$ is a resistance associated with a low resistance state of the memristor $M_1$ or $M_2$ and $R_{HRS}$ is a resistance associated with a high resistance state of the memristor $M_1$ or $M_2$.

The voltages $V_{set}$ and $V_{reset}$ may be set appropriately to take account of the voltage drops resulting from the channel resistances of the transistors $T_1$, $T_2$, and $T_3$. In particular, the magnitudes of $V_{set}$ and $V_{reset}$ may be set to any values that are large enough to result in setting and resetting, respectively, the memristors $M_1$ or $M_2$ when applied in the manner described above. Specifically, if $V_{set\_min}$ is the minimum voltage difference across the memristor $M_1$ or $M_2$ that will result in setting the memristor $M_1$ or $M_2$, then $V_{set}$ may be equal to or greater than $V_{set\_min} + 2 \cdot V_{set\_min}/\alpha_{min}$. Similarly, if $V_{reset\_min}$ is the minimum voltage that will result in resetting the memristor $M_1$ or $M_2$, then $V_{reset}$ may be equal to or greater than $V_{reset\_min} + 2 \cdot V_{reset\_min}/\alpha_{min}$. $V_{set}$ and $V_{reset}$ do not necessarily need to have the same magnitude, since $V_{set\_min}$ is not necessarily the same as $V_{reset\_min}$. However, $V_{set}$ and $V_{reset}$ could be set to the same value as long as that value is large enough to accomplish both setting and resetting operations. In certain examples, $V_{DD} = V_{set} = V_{reset}$, where $V_{DD}$ is a highest voltage level of the TCAM. The values of $V_{set\_min}$ and $V_{reset\_min}$ may be parameters of the memristor $M_1$ or $M_2$ that are known in advance, that are determined theoretically based on a model of the memristor $M_1$ or $M_2$, or that are determined experimentally.

The value that is stored in the bit cell 110 may be determined by determining the respective resistance states of both the first and second memristors $M_1$ and $M_2$ and determining which value is associated with the combination of resistance states according to a predetermined association rule, such as the rule illustrated in FIG. 2. The process of determining the resistance state of one of the first and second memristors $M_1$ and $M_2$ may be referred to individually as reading the memristor $M_1$ or $M_2$, while the collection of processes that result in the determination of the value stored in the bit cell 110 may be referred to collectively as a "read operation" for the bit cell 110.

The first memristor $M_1$ may be read by applying a read voltage difference (with any polarity) across the first memristor $M_1$ and measuring a current that flows through the first memristor $M_1$. The current that flows through the memristor $M_1$ may be sensed via the first data line SL. Then, the magnitude of the current that flows through the memristor $M_1$ may be used to determine the resistance state of the memristor $M_1$ (e.g., a high resistance state will result in low current, while a low resistance state will result in high current). For example, the first and third transistors $T_1$ and $T_3$ may be turned on, the ground voltage GND may be applied to the first data line SL, and a read voltage $V_{read}$ may be applied to the second rail ND. This causes the read voltage difference to be applied across the memristor $M_1$ with the second polarity (i.e., right-to-left). As a result, current flows from the second rail ND to the first data line SL, passing through the first memristor $M_1$. Because turning on the first transistor $T_1$ also results in turning on the second transistor $T_2$ (thereby connecting the second memristor $M_2$ to the second data line $\overline{SL}$), if it is desired to prevent a voltage difference from be applied across the memristor $M_2$ while the first memristor $M_1$ is being read, the second data line $\overline{SL}$ may be floated.

Similarly, the second memristor $M_2$ may be read by applying the read voltage difference across the second memristor $M_2$ (with any polarity) and measuring a current that flows through the second memristor $M_2$. The current that flows through the memristor $M_2$ may be sensed via the second data line $\overline{SL}$. Then, the magnitude of the current that flows through the memristor $M_2$ may be used to determine the resistance state of the memristor $M_2$ (e.g., a high resistance state will result in low current, while a low resistance state will result in high current). For example, the second and third transistors $T_2$ and $T_3$ may be turned on, the ground voltage GND may be applied to the second data line $\overline{SL}$, and the read voltage $V_{read}$ may be applied to the second rail ND. This causes the read voltage difference to be applied across the memristor $M_2$ with the first polarity (i.e., left-to-right). As a result, current flows from the second rail ND to the second data line $\overline{SL}$, passing through the second memristor $M_2$. Because turning on the second transistor $T_2$ also results in turning on the first transistor $T_1$ (thereby connecting the first memristor $M_1$ to the first data line SL), if it is desired to prevent a voltage difference from be applied across the memristor $M_1$ while the second memristor $M_2$ is being read, the first data line SL may be floated.

In certain examples, the memristors $M_1$ and $M_2$ may be read simultaneously by applying $V_{DD}$ to the word line WL and to the third data line SX, applying GND to both the first and second data lines SL/$\overline{SL}$, and applying $V_{read}$ to the second rail ND; the first data line SL may be used to sense the current flowing through first memristor $M_1$, while the second data line $\overline{SL}$ may be used to sense the current flowing through second memristor $M_2$.

In general, applying voltage differences across the memristor $M_1$ or $M_2$ whose magnitudes are relatively small in comparison to the setting/resetting voltage differences will not significantly affect the resistance state of the memristor $M_1$ or $M_2$. Thus, in order to ensure that reading the memristor $M_1$ or $M_2$ does not change a resistance state of the memristor $M_1$ or $M_2$, the read voltage difference may be set to a value that is less than the setting and resetting voltage differences, as applicable given the polarity with which the read voltage difference is applied. In particular, in certain examples $V_{read}$ may be set to a value less than $V_{set\_min} + 2 \cdot V_{set\_min}/\alpha_{max}$ and less than $V_{reset\_min} + 2 \cdot V_{reset\_min}/\alpha_{max}$. In certain examples that include unipolar memristors $M_1$ and $M_2$, when a voltage difference is applied with a particular polarity, it does not disturb a resistance state of the memristor $M_1$ or $M_2$ regardless of its magnitude; thus, in such an example, a value of $V_{read}$ need not be restricted if applied with the particular polarity that does not disturb the resistance state.

[Example Search Operations—Individual Bit Cell]

The example bit cell 110 may be searched based on three search criteria—namely 0, 1, and a wildcard (denoted Y herein for convenience). The configuration of the bit cell 110 and the voltages that are applied to the bit cell during a search operation are set such that search operations produce the search results illustrated in FIG. 3. In particular, when the bit cell 110 is searched based on the 0 search criterion, the result is a match if the bit cell 110 stores a 0 (i.e., if $R_{M1} \approx R_{LRS}$ and $R_{M2} \approx R_{HRS}$), a miss if the bit cell 110 stores a 1 (i.e., if $R_{M1} \approx R_{HRS}$ and $R_{M2} \approx R_{LRS}$), and a match if the bit cell stores an X (i.e., if $R_{M1} \approx R_{M2}$). When the bit cell 110 is searched based on the 1 search criterion, the result is a miss if the bit cell 110 stores a 0 (i.e., if $R_{M1} \approx R_{LRS}$ and $R_{M2} \approx R_{HRS}$), a match if the bit cell 110 stores a 1 (i.e., if $R_{M1} \approx R_{HRS}$ and $R_{M2} \approx R_{LRS}$), and a match if the bit cell stores an X (i.e., if $R_{M1} \approx R_{M2}$). When the bit cell 110 is searched based on the wildcard search criterion (Y), the result is a match regardless of what value is stored by the bit cell 110. A miss is indicated by the match-line transistor $T_4$ being turned on, thereby pulling down a voltage of the match line ML (which was previously pre-charged). A match is indicated by the match-line transistor $T_4$ being kept off, thereby leaving the match line at its pre-charged voltage.

The conductive state of the match-line transistor $T_4$ during a search operation is controlled by the voltage of the node G. Thus, in order to achieve the search results described above, the voltage of the node G during a search operation should be an ON-voltage when the bit cell 110 stores a value that is a miss and an OFF-voltage when the bit cell 110 stores a value that is a match. When a gate-source voltage of the match-line transistor $T_4$ is greater than a threshold voltage thereof ($V_{th}$), the match-line transistor $T_4$ is turned on, and when a gate-source voltage of the match-line transistor $T_4$ is less than $V_{th}$, the match-line transistor $T_4$ is turned off. Thus, an ON-voltage for the match-line transistor $T_4$ is any voltage that is greater than $V_{th}+V_L$ and on OFF-voltage for the match-line transistor $T_4$ is any voltage that is less than $V_{th}+V_L$, where $V_L$ is the voltage applied to the first rail NS during a search operation.

FIGS. 5A and 5B illustrate search operations for the example bit cell 110 that result in voltages appearing on the node G that achieve the above-described search results. In particular, to search the bit cell 110 based on the 0 search criterion, the match line ML may be pre-charged to a pre-charge voltage $V_{pre}$, the first and second transistors $T_1$ and $T_2$ may be turned on by applying $V_{DD}$ to the word line WL, the ground voltage GND may be applied to the first data line SL, a search voltage $V_{search}$ may be applied to the second data line $\overline{SL}$, and a voltage $V_L$ may be applied to the first rail NS, as illustrated in FIGS. 5A and 5B. To search the bit cell 110 based on the 1 search criterion, the match line ML may be pre-charged to a pre-charge voltage $V_{pre}$, the first and second transistors $T_1$ and $T_2$ may be turned on by applying $V_{DD}$ to the word line WL, the search voltage $V_{search}$ may be applied to the first data line SL, the ground voltage GND may be applied to the second data line $\overline{SL}$, and the voltage $V_L$ may be applied to the first rail NS, as illustrated in FIGS. 5A and 5B. To search the bit cell 110 based on the wildcard (Y) search criterion, the match line ML may be pre-charged to a pre-charge voltage $V_{pre}$, the first and second transistors $T_1$ and $T_2$ may be turned on by applying $V_{DD}$ to the word line WL, and the ground voltage GND may be applied to both the first and second data lines SL and $\overline{SL}$. During the wildcard search, the third data line SX may be set to $V_{DD}$ and the second rail ND to GND, thereby connecting the node G to GND.

When the resistance states of the first and second memristors $M_1$ and $M_2$, the threshold voltage $V_{th}$ of the match-line transistor $T_4$, and the voltages described above are appropriately set, the search operations described above will result in voltages appearing on the node G that achieve the above-described search results. The reasons for this, as well as criteria for setting these parameters appropriately, are explained in greater detail below.

Figure 1B:
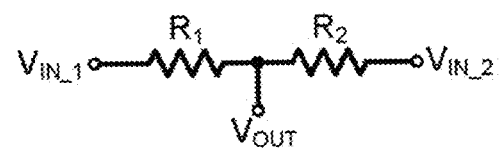
FIG. 1B is a circuit diagram illustrating an example resistive divider.

The voltage of the node G during a searching operation may be modeled by considering the first memristor $M_1$ and the second memristor $M_2$ as being resistors of a resistive divider 111. In general, a resistive divider is formed when two resistors are connected in series, input voltages are applied to opposite input terminals of the resistors, and an output voltage is taken from a common node between the resistors. In particular, FIG. 1B illustrates a generalized form of a resistive divider, with resistors $R_1$ and $R_2$ being connected in series, input voltages $V_{IN\_1}$ and $V_{IN\_2}$ being applied to the input terminals, and the output voltage $V_{OUT}$ being taken from the common node between the resistors $R_1$ and $R_2$, which is the output terminal of the resistive divider. The output voltage $V_{OUT}$ of the generalized resistive divider from FIG. 1B may be given by the following, in which $R_1$ and $R_2$ are the resistances of the resistors $R_1$ and $R_2$, respectively:

$$V_{OUT} = \frac{R_2 V_{IN\_1} + R_1 V_{IN\_2}}{R_1 + R_2} \quad \text{(eq. 1)}$$

In a certain sense, a memristor is not the same type of circuit component as a resistor, as the memristor can have its resistance changed over time while a resistor generally has a constant resistance. However, during periods of time in which voltage differences that are less than the setting or resetting voltage differences are applied across the memristor, the memristor has an approximately constant resistance, and thus the memristors $M_1$ and $M_2$ may be modeled approximately during these periods as resistors.

When the first memristor $M_1$ and the second memristor $M_2$ are considered as being the resistors of a resistor divider 111 (corresponding, respectively, to the resistors $R_1$ and $R_2$ of the generalized resistive divider), then the input terminals of the resistive divider 111 are the left-side terminal of the memristor $M_1$ that is connected to the first switching transistor $T_1$ and the right-side terminal of the memristor $M_2$ that is connected to the second switching transistor $T_2$. Thus, when the first and second switching transistors $T_1$ and $T_2$ are turned on (i.e., when $V_{DD}$ is applied to the word line WL), the input voltages that are supplied to the resistive divider 111 are the voltage carried by the first data line SL ($V_{SL}$) and the voltage carried by the second data line ($V_{\overline{SL}}$) (corresponding, respectively, to the input voltages $V_{IN\_1}$ and $V_{IN\_2}$ of the generalized resistive divider). The output terminal of the resistive divider 111 is the node G, and thus the output voltage of the resistive divider 111 is the voltage of the node G ($V_G$) (corresponding to the output voltage $V_{OUT}$ of the generalized resistive divider). Thus, from equation 1, the voltage of the node G when the first and second switching transistors $T_1$ and $T_2$ are turned on may be modeled by the following:

$$V_G = \frac{R_{M2}V_{SL} + R_{M1}V_{\overline{SL}}}{R_{M1} + R_{M2}} \quad \text{(eq. 2)}$$

where $R_{M1}$ is the present resistance of the first memristor $M_1$ and $R_{M2}$ is the present resistance of the second memristor $M_2$.

During a search operation based on the 0 search criterion, the input voltages of the resistive divider 111 become $V_{SL}=\text{GND}$ and $V_{\overline{SL}}=V_{search}$. Thus, from equation 2 the voltage of the node G during a search based on the 0 search criterion (denoted herein by $V_G|^{S=0}$) becomes:

$$V_G|^{S=0} = \frac{R_{M1}}{R_{M1} + R_{M2}} V_{search} \quad \text{(eq. 3)}$$

During a search operation based on the 1 search criterion, the input voltages of the resistive divider 111 become $V_{SL}=V_{search}$ and $V_{\overline{SL}}=\text{GND}$. Thus, from equation 2 the voltage of the node G during a search based on the 1 search criterion (denoted herein by $V_G|^{S=1}$) becomes:

$$V_G|^{S=1} = \frac{R_{M2}}{R_{M1} + R_{M2}} V_{search} \quad \text{(eq. 4)}$$

The resistance values $R_{M1}$ and $R_{M2}$ may change depending on the value that is stored in the bit cell 100, and therefore $V_G|^{S=0}$ and $V_G|^{S=1}$ will have different values depending on what value is stored in the bit cell 100. When the memristors $M_1$ or $M_2$ are set to the low resistance state, their respective resistances $R_{M1}$ and $R_{M2}$ may be approximated by $R_{LRS}$, which is a resistance associated with the low resistance state. When the memristors $M_1$ or $M_2$ are reset to the high resistance state, their respective resistances $R_{M1}$ and $R_{M2}$ may be approximated by $R_{HRS}$, which is a resistance associated with the high resistance state. Thus, from equations 3 and 4 the voltage of the node G may be determined for each stored value (i.e., for each combination of resistances states) as follows.

If the search criterion is 0 and the bit cell 110 stores a 0, then, using equation 3 with $R_{M1} \approx R_{LRS}$ and $R_{M2} \approx R_{HRS}$, the voltage of the node G in this state (denoted herein by $V_G|_{D=0}^{S=0}$) will become:

$$V_G\Big|_{D=0}^{S=0} \approx \frac{R_{LRS}}{R_{LRS} + R_{HRS}} V_{search} \quad \text{(eq. 5)}$$

This state is illustrated in FIG. 5B at the intersection of the column labeled "search criterion=0" and the row labeled "stored bit=0".

If the search criterion is 0 and the bit cell 110 stores a 1, then, using equation 3 with $R_{M1} \approx R_{HRS}$ and $R_{M2} \approx R_{LRS}$, the voltage of the node G in this state (denoted herein by $V_G|_{D=1}^{S=0}$) will become:

$$V_G\Big|_{D=1}^{S=0} \approx \frac{R_{HRS}}{R_{HRS} + R_{LRS}} V_{search} \quad \text{(eq. 6)}$$

(eq. 6)

This state is illustrated in FIG. 5B at the intersection of the column labeled "search criterion=0" and the row labeled "stored bit=1".

If the search criterion is 1 and the bit cell stores a 0, then using equation 4 with $R_{M1} \approx R_{LRS}$ and $R_{M2} \approx R_{HRS}$, the voltage of the node G in this state (denoted herein by $V_G|_{D=0}^{S=1}$) will become:

$$V_G\Big|_{D=0}^{S=1} \approx \frac{R_{HRS}}{R_{LRS} + R_{HRS}} V_{search} \quad \text{(eq. 7)}$$

This state is illustrated in FIG. 5B at the intersection of the column labeled "search criterion=1" and the row labeled "stored bit=0".

If the search criterion is 1 and the bit cell 110 stores a 1, then, using equation 4 with $R_{M1} \approx R_{HRS}$ and $R_{M2} \approx R_{LRS}$, the voltage of the node G in this state (denoted herein by $V_G|_{D=1}^{S=1}$) will become:

$$V_G\Big|_{D=1}^{S=1} \approx \frac{R_{LRS}}{R_{HRS} + R_{LRS}} V_{search} \quad \text{(eq. 8)}$$

This state is illustrated in FIG. 5B at the intersection of the column labeled "search criterion=1" and the row labeled "stored bit=1".

If the stored value is X (wildcard) and the search criterion is either 0 or 1, then using either equation 3 or equation 4 with $R_{M1}=R_{M2}$, the voltage of the node G in this state (denoted herein by $V_G|_{D=X}^{S=0}$ or $V_G|_{D=X}^{S=1}$) will become:

$$V_G\Big|_{D=X}^{S=0} = V_G\Big|_{D=X}^{S=1} = \frac{1}{2} V_{search} \quad \text{(eq. 9)}$$

This state is illustrated in FIG. 5B at the intersections of row labeled "stored bit=X" and the columns labeled "search criterion=0" and "search criterion=1".

If the search operation is based on the Y search criterion, the transistor $T_3$ is turned on by applying $V_{DD}$ to the third data line SX, thus connecting the node G to the second rail ND. Because the second rail ND carries GND during search operations, the voltage of the node G in this scenario becomes GND regardless of the resistance states of the memristors $M_1$ and $M_2$ and regardless of the voltages that are applied to the first and second data lines SL/$\overline{SL}$. This is illustrated in FIG. 5B in the column labeled "search criteria=Y". To conserve power, GND may also be applied to the first and second data lines SL/$\overline{SL}$ in this scenario.

From equations 5 and 8 it can be seen that the same voltage appears on the node G when the search criterion is 0 and the stored value is 0 as when the search criterion is 1 and the stored value is 1 (both of which are matches)—i.e., $V_G|_{D=0}^{S=0}=V_G|_{D=1}^{S=1}$. Because $R_{LRS}<R_{HRS}$, the voltage $V_G|_{D=0}^{S=0}=V_G|_{D=1}^{S=1}$ is a relatively low voltage, as illustrated in FIG. 5B. For example, if $R_{HRS}=4 \cdot R_{LRS}$, then $V_G|_{D=0}^{S=0}=V_G|_{D=1}^{S=1}=\frac{1}{5}V_{search}$. The larger the difference between $R_{HRS}$ and $R_{LRS}$, the smaller the voltage $V_G|_{D=0}^{S=0}=V_G|_{D=1}^{S=1}$ will be. However, even if $R_{HRS}$ and $R_{LRS}$ are relatively close in value, $V_G|_{D=0}^{S=0}=V_G|_{D=1}^{S=1}$ will always be less than $\frac{1}{2}V_{search}$. Thus, because $V_G|_{D=0}^{S=0}=V_G|_{D=1}^{S=1}$ is a low value, the match-line transistor $T_4$ is turned off, which is the desired result for these searches since they are matches. More specifically, by appropriately setting $V_{search}$ and $V_L$ in view of $R_{HRS}$, $R_{LRS}$, and $V_{th}$, it can be ensured that the gate-source voltage of the match-line transistor $T_4$ during these searches is less than the threshold voltage $V_{th}$.

From equations 6 and 7 it can be seen that the same voltage appears on the node G when the search criterion is 0 and the stored value is 1 as when the search criterion is 1 and the stored value is 0 (both of which are misses)—i.e., $V_G|_{D=1}^{S=0}=V_G|_{D=0}^{S=1}$. Because $R_{LRS}<R_{HRS}$, the voltage $V_G|_{D=1}^{S=0}=V_G|_{D=0}^{S=1}$ is a relatively high voltage, as illustrated in FIG. 5B. For example, if $R_{HRS}=4 \cdot R_{LRS}$, then $V_G|_{D=1}^{S=0}=V_G|_{D=0}^{S=1}=\frac{4}{5}V_{search}$. The larger the difference between $R_{HRS}$ and $R_{LRS}$, the larger the voltage $V_G|_{D=1}^{S=0}=V_G|_{D=0}^{S=1}$ will be. However, even if $R_{HRS}$ and $R_{LRS}$ are relatively close in value, $V_G|_{D=1}^{S=0}=V_G|_{D=0}^{S=1}$ will always be greater than $\frac{1}{2}V_{search}$. Thus, because $V_G|_{D=1}^{S=0}=V_G|_{D=0}^{S=1}$ is a high value, the match-line transistor $T_4$ is turned on, which is the desired result. More specifically, by appropriately setting $V_{search}$ and $V_L$ in view of $R_{HRS}$, $R_{LRS}$, and $V_{th}$, it can be ensured that the gate-source voltage of the match-line transistor $T_4$ during these searches is higher than the threshold voltage $V_{th}$.

From equation 9, it can be seen that the voltage of the node G is $\frac{1}{2}V_{search}$ when X is stored in the bit cell and when either 0 or 1 is the search criterion.

Thus, based on the forgoing considerations, appropriate values for the voltages $V_{search}$ and $V_L$ may be established according to the following criteria in order to ensure the search results illustrated in FIG. 3 are achieved:

$$\frac{1}{2}V_{search} < V_L + V_{th} < \frac{R_{HRS}}{R_{LRS}+R_{HRS}}V_{search} \quad \text{(eq. 10)}$$

In addition to the constraints of equation 10, the value of $V_{search}$ may also be established so as to avoid inadvertently setting or resetting one of the memristors $M_1$ or $M_2$ during a searching operation. For example, when 0 is the search criterion and 0 is stored, if the magnitude of $V_{search}$ is too high, then it is possible that a voltage difference that is applied across the second memristor $M_2$ (which is in the high resistance state in this scenario) could be larger than $V_{set\_min}$ and could have the correct polarity for setting the memristor $M_2$, thus inadvertently changing the memristor $M_2$ from the high resistance state to the low resistance state. Other combinations of search criterion and stored value could also result in inadvertently setting or resetting one of the memristors $M_1$ and $M_2$. To avoid these phenomenon, $V_{search}$ may be established such that:

$$V_{search} < \frac{R_{HRS}+R_{LRS}}{R_{HRS}}V_{set\_min}; \text{ and} \quad \text{(eq. 11)}$$

$$V_{search} < \frac{R_{HRS}+R_{LRS}}{R_{LRS}}V_{reset\_min}$$

[TCAMs—Detailed Examples]

An example TCAM may includes an array of multiple bit cells 110. The bit cells 110 may be arrayed in rows and columns. The TCAM may include multiple word lines WL (one per word storage block), multiple match lines ML (one per word storage block), multiple first data lines SL (one per column), multiple second data lines $\overline{SL}$ (one per column), multiple third data lines SX (one per column), a first rail NS, and a second rail ND.

The bit cells 110 may be grouped into word storage blocks, where all of the bit cells 110 that are part of the same word storage block are in the same row as one another and are connected to the same match line ML as one another. The bit cells 110 that are part of the same word storage block may also be connected to the same word line WL as one another. The word storage blocks may each have the same number of bit cells 110 as the number of bits per word, where a word is a data unit used by the example TCAM 100 for writing, reading, and/or searching. In certain examples, each row of the array may include one word storage block (see the example illustrated in FIG. 6), while in other examples each row of the array may include multiple word storage blocks. If there are multiple word storage blocks per row, then there may be multiple match lines ML per row, as each word storage block has a corresponding match line ML. If there are multiple word storage blocks per row and if each word storage block has its own word line WL, then there may be multiple match lines ML per row.

Because all of the bit cells 110 in a given word storage block are connected to the same match line ML as one another, during a search operation the match line ML of a given word storage block may be pulled low if any one of its bit cells 110 stores a value that is a miss to a corresponding bit of a input search word (even if all of the other bit cells 110 in the word storage block are a match). Thus, it can be easily determined whether a word storage block stores a word that matches an input search word by monitoring whether its corresponding match line is pulled low.

In examples in which all of the bit cells 110 in a given word storage block are connected to the same word line WL as one another, all of the bit cells 110 in the given word storage block may be selected at the same time by turning on the word line WL that corresponds to the given word storage block.

Each bit cell 110 in a given column may be connected to the same first data line SL, the same second data line $\overline{SL}$, and the same third data line SX as one another. Thus, each bit cell 110 in a same column may be searched simultaneously based on the same search criterion.

Each bit cell 110 in the array may be connected to the same first rail NS as one another, where the first rail NS is a collection of one or more wirings that are connected to one another so as to carry the same voltage as one another.

In certain examples, each bit cell 110 in the array may be connected to the same second rail ND as one another, where the second rail ND is a collection of one or more wirings that are connected to one another so as to carry the same voltage as one another. In such examples, it might not be possible to simultaneously set a memristor $M_1$ or $M_2$ of one bit cell 110 and reset a memristor $M_1$ or $M_2$ of another bit cell 110, since different voltages of the second rail ND are used for setting and resetting (see FIG. 4). In certain other examples, multiple distinct second rails ND—one for each column of the array—may be provided. In such examples, because the voltages of the second rails ND may be individually controllable, a memristor $M_1$ or $M_2$ of one bit cell 110 may be set at the same time that a memristor $M_1$ or $M_2$ of another bit cell 110 is being reset.

Figure 6:
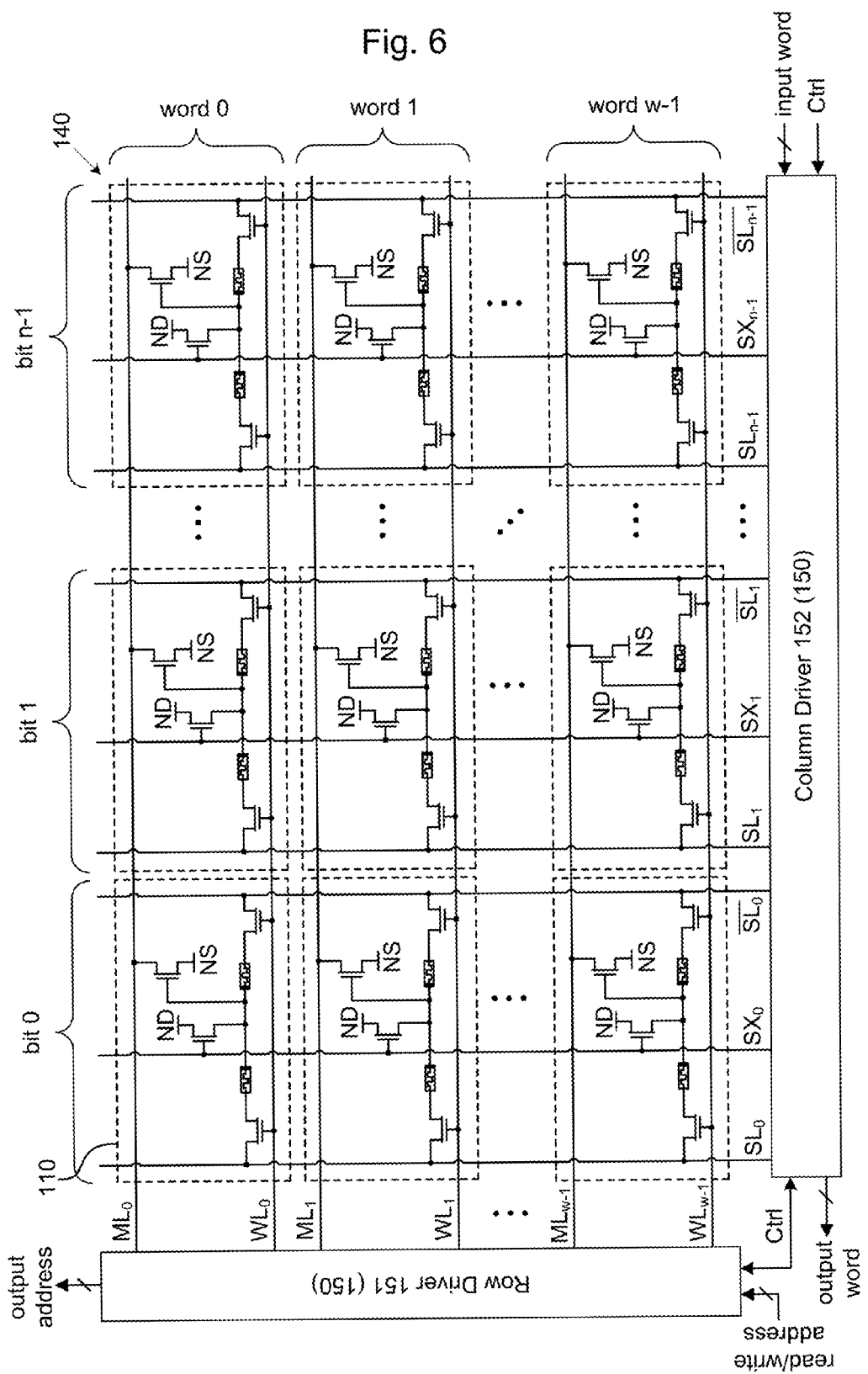
FIG. 6 is a diagram illustrating an example TCAM with an array of multiple bit cells.

FIG. 6 illustrates an example TCAM 100 in which an array 140 of bit cells 110 has W rows and N columns, with one word storage block per row. Hence, the example TCAM 100 may include word lines $WL_0$ through $WL_{W-1}$, match lines $ML_0$ through $ML_{W-1}$, first data lines $SL_0$ through $SL_{N-1}$, second data lines $\overline{SL}_0$ through $\overline{SL}_{N-1}$, third data lines $SX_0$ through $SX_{N-1}$, a first rail NS, and a second rail ND.

Because there is one word storage block per row in the example TCAM 100, there are W word storage blocks in the TCAM 100, i.e., word 0 through word W−1, and a word size in the example TCAM 100 is N bits. Thus, each column corresponds to a specific bit position, i.e., bit 0 through bit N−1. The data value stored in a given bit cell 110 corresponds to a specific bit of a word that is stored in the word storage block that includes the give bit cell 110, with the position of the bit within the stored word being determined by the bit position of the column in which the bit cells 110 is disposed.

The TCAM 100 may include control circuitry 150 that applies signals to the various wiring lines mentioned above so as to control operations of the bit cells 110, such as read, write, and search operations. The control circuitry 150 may comprise drivers, shift registers, decoders, and the like that are connected to the various wiring lines of the array 140. The control circuitry 150 may receive a control signal Ctrl that instructs the control circuitry 150 which operation it should perform. The control circuitry 150 may also receive a read/write address that indicates a target word storage block for a read operation or a write operation. The control circuitry 150 may output an output word as a result of performing a read operation, with the output word corresponding to the word that is stored in the word storage block whose address corresponds to the read/write address. The control circuitry 150 may also receive an input word that indicates either a word that the TCAM 100 is to be searched for during a search operation or a word that is to be written to a particular word storage block during a write operation. The control circuitry 150 may also output an output address as a result of performing a search operation, with the output address corresponding to the address (or addresses) of any word storage block(s) whose stored word matches the input search word.

In FIG. 6, the control circuitry 150 is illustrated as including a row driver 151 and a column driver 152. The row driver 151 may include one or more drivers, shift registers, decoders, and the like that are connected to and drive wiring lines that correspond to rows of the array 140. The column driver 152 may include one or more drivers, shift registers, decoders, and the like that are connected to and drive wiring lines that correspond to columns of the array 140.

In particular, the row driver 151 may be connected to the word lines $WL_0$ through $WL_{W-1}$ and the match lines $ML_0$ through $ML_{W-1}$, and may supply electrical signals to and/or sense electrical signals carried on these wiring lines. For example, the row driver 151 may include decoders and drivers that are to select one of the word storage blocks by applying $V_{DD}$ to one of the word lines WL based on an input read/write address during a read or write operation, and that is to apply $V_{DD}$ to all of the word lines WL during a search operation. As another example, the row driver 151 may include decoders and drivers that are to, during a search operation, pre-charge all of the match lines ML, sense which match lines ML do or do not have their voltage pulled low, and output addresses of any word storage blocks whose match lines ML were not pulled low.

The column driver 152 may be connected to the first data lines $SL_0$ through $SL_{N-1}$, the second data lines $\overline{SL}_0$ through $\overline{SL}_{N-1}$, and the third data lines $SX_0$ through $SX_{N-1}$, and may supply electrical signals to and/or sense electrical signals carried on these wiring lines. For example, the column driver 152 may include decoders and drivers that are to selectively apply $V_{set}$, $V_{reset}$, or GND variously to the first data lines SL based on an input word during a writing operation, apply $V_{read}$ or GND to each of the first data lines SL during a read operation, and selectively apply $V_{search}$ or GND variously to the first data lines SL based on an input search word during a search operation. As another example, the column driver 152 may include decoders and drivers that are to selectively apply $V_{set}$, $V_{reset}$, or GND variously to the second data lines $\overline{SL}$ based on an input word during the writing operation, apply GND or $V_{read}$ to each of the second data lines $\overline{SL}$ during the read operation, and selectively apply GND or $V_{search}$ variously to the second data lines $\overline{SL}$ based on an input search word during the search operation. As another example, the column driver 152 may include decoders and drivers that are to apply $V_{DD}$ to each of the third data lines SX during a reading or writing operation and to selectively apply $V_{DD}$ or GND variously to the third data lines SX based on an input search word during a search operation.

The first rail NS may be connected to a driver(s) that applies GND to the first rail NS during a reading or writing operation, and applies $V_L$ to the first rail NS during a searching operation. This driver(s) may be part of, for example, the row driver 151 or the column driver 152.

The second rail ND may be connected to a driver(s) that selectively applies $V_{reset}$ or GND to the first rail NS based on an input word during a writing operation (see FIG. 4), applies $V_{read}$ to the second rail ND during a read operation, and applies GND to the second rail ND during a search operation. This driver(s) may be part of, for example, the row driver 151 or the column driver 152.

It should be understood that separate drivers could be provided to drive different types of wiring lines (e.g., one driver drives the first data lines SL and a separate driver drives the second data lines $\overline{SL}$), or that a single driver could be provided to drive multiple different types of wiring lines (e.g., a single driver drives both the first data lines SL and the second data lines $\overline{SL}$). Furthermore, it should be understood that the various components of the control circuitry 150 could be physically located on any side or combination of sides of the array 140, and that the relative locations illustrated in FIG. 6 are not intended to imply physical locations of the components in a physical device that instantiates the example TCAM 100.

[Example Read/Write Operations—TCAM]

When the control signal Ctrl instructs the control circuitry 150 that a read operation or a write operation is to be performed, the row driver 151 may select a target word storage block based on the input read/write address by applying $V_{DD}$ to its corresponding word line WL, and the column driver 152 may then proceed to apply voltages to the column wiring lines according to the table in FIG. 4 to perform the read/write operations for each bit cell 110 in the selected word storage block in the manner described above with respect to reading a single bit cell 110.

During a read operation, all of the memristors $M_1$ and $M_2$ in the target word storage block may be simultaneously read, or the first memristors $M_1$ and the second memristors $M_2$ may be read sequentially (the order does not matter), with the reading operation for each individual memristor being performed in the manner described above with respect to reading operations for single bit cells 110. For example, to read all of the memristors $M_1$ and $M_2$ of the target word storage block simultaneously, the corresponding word line WL may be selected, GND may be applied to all of the first data lines $SL_0$ through $SL_{N-1}$ and all of the second data lines $\overline{SL}_0$ through $\overline{SL}_{N-1}$, $V_{DD}$ may be applied to all of the third data lines $SX_0$ through $SX_{N-1}$, and $V_{read}$ may be applied to the second rail ND (or to each column wiring of the second rail ND if the second rail ND comprises multiple distinct wirings). In this state, the column driver 152 may sense the currents flowing through the first memristors $M_1$ of the target word storage block via the first data lines $SL_0$ through $SL_{-1}$, respectively, and may sense the currents flowing through the second memristors $M_2$ of the target word storage block via the second data lines $\overline{SL}_0$ through $\overline{SL}_{N-1}$, respectively. The column driver 152 may determine the resistances states of the memristors $M_1$ and $M_2$ of each bit cell 110 of the selected word based on the respective currents flowing through the memristors, and a data value stored in each bit cell 110 of the target word storage block may be determined based on the combination of resistance states of the memristors $M_1$ and $M_2$ of the bit cell 110 (see FIG. 2). The respective data values stored in the N bit cells 110 of the target words storage block may then be combined based on the respective bit positions of the bit cells 110 into an N-bit output word (e.g., a data value of the bit-k position bit cell 110 is output as the $k^{th}$ bit of the output word, for k={0, 1, ... N−1}).

During a write operation, the column driver 152 may determine, for each of the N bit cells 110 in the target word storage block, whether the particular bit cell 110 should store 0, 1, or X (wildcard) based on a bit-position of the particular bit cell 110 and an N-bit input word (e.g., the bit-k position bit cell 110 is to store the $k^{th}$ bit of the input word, for k={0, 1, ... N−1}). The writing operation may then be performed in two stages: first, all of the memristors $M_1$ and $M_2$ in the target word storage block may be placed in the same resistance state (i.e., all are set or all are reset), and second, specific memristors $M_1$ and/or $M_2$ in the target word storage block may be changed to a different resistance state in order to cause each of the bit cells 110 in the target word storage block to store its appropriate value. In the first stage, all of the memristors $M_1$ and $M_2$ in the target word storage block may be placed into the same state simultaneously, or the first memristors $M_1$ and the second memristors $M_2$ may be placed in the desired state sequentially (in any order). For example, in the first stage, the control circuitry 150 may reset all of the memristors $M_1$ and $M_2$ in the target word storage block simultaneously by: selecting the word line WL corresponding to the target word storage block, applying GND to all of the first data lines $SL_0$ through $SL_{-1}$ and to all of the second data lines $\overline{SL}_0$ through $\overline{SL}_{N-1}$, applying $V_{DD}$ to all of the third data lines $SX_0$ through $SX_{N-1}$, and applying $V_{reset}$ to the second rail ND. As another example, in the second stage, the control circuitry 150 may set specific memristors $M_1$ and/or $M_2$ in the target word storage block by: selecting the word line WL corresponding to the target word storage block, applying $V_{DD}$ to all of the third data lines $SX_0$ through $SX_{N-1}$, applying GND to the second rail ND, applying $V_{set}$ to each first data line SL that corresponds a bit cell 110 that is to store 0, applying GND to each second data line $\overline{SL}$ that corresponds a bit cell 110 that is to store 0, applying GND to each first data line SL that corresponds a bit cell 110 that is to store 1, applying $V_{set}$ to each second data line $\overline{SL}$ that corresponds a bit cell 110 that is to store 1, and applying GND to each first data line SL and each second data line $\overline{SL}$ that corresponds to a bit cell 110 that is to store X.

Although the reading and writing operations were described above as being performed in units of words, it should be understood that writing could be performed in other units. For example, any number of bit cells 110 could be written to or read from without necessarily writing to or reading the other bit cells 110 in the same word storage block. In such an example, the word line WL of the word storage block that contains the target bit cell(s) 110 could be selected, the ground voltage GND could be applied to all of the first, second, and third data lines SL/$\overline{SL}$/SX that correspond to bit cells 110 that are not the target bit cell(s), and the voltages for the writing/reading operation could be applied to the first, second, and third data lines SL/$\overline{SL}$/SX of the target bit cell(s) 110.

[Example Search Operations—TCAM]

The control circuitry 150 may control the TCAM 100 to perform a search operation across the entire array 140 simultaneously. In particular, when the control signal Ctrl instructs the control circuitry 150 that a search operation is to be performed, the row driver 151 may select all of the word storage blocks simultaneously by applying $V_{DD}$ to all of the word lines WL, and may pre-charge all of the match lines ML. The column driver 152 may then proceed to apply voltages to the column lines to perform the search operation, with bit cells 110 that are in the same column as one another being searched based on a same search criterion as one another. The search criterion for each column may be determined by the column driver 152 based on the input search word and bit positions that correspond to the columns (e.g., each bit cell 110 in the bit-k position column is searched based on the criterion corresponding to the $k^{th}$ bit of the input search word, for k={0, 1, ... N−1}). For each column of the array 140, voltages may be applied to the first, second, and third data lines SL/$\overline{SL}$/SX that correspond to the respective column based on the search criterion for the respective column in the manner that was described above with respect to searching a single bit cell 110 (see also FIGS. 5A and 5B). The row driver 151 may then monitor the match lines ML to determine which are pulled low (indicating that the corresponding word storage block stores a word that is a miss) and which match lines ML remain charged (indicating that the corresponding word storage block stores a word that is a match). The row driver 151 may output an address of any word storage block that is a match.

Figure 7:
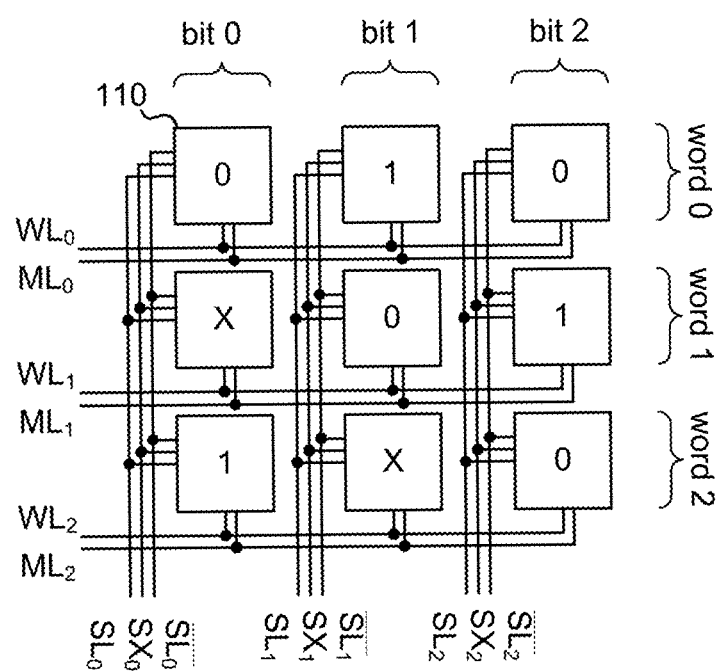
FIG. 7 is a diagram illustrating an example TCAM with an array of bit cells storing particular values.

For example, consider the example TCAM 100 illustrated in FIG. 7, which includes an array 140 having three rows and three columns of bit cells 110, with the bit cells 110 each storing values as indicated in the figure. Suppose that this example TCAM 100 is searched with the input search word being "Y10". The column driver 152 will receive the input search word and the control signal Ctrl indicating a search operation, and based thereon would determine that the bit-0 column should be searched based on the wildcard search criterion (since the $0^{th}$ bit of the search word is Y), the bit-1 column should be searched based on the 1 search criterion (since the 1st bit of the search word is 1), and the bit-2 column should be searched based on the 0 search criterion (since the 2nd bit of the search word is 0). Accordingly, the column driver 152 may perform the search operation by applying voltages to the various wiring lines as follows:

|  | bit-0 column (Y search criterion) | | | bit-1 column (1 search criterion) | | | bit-2 column (0 search criterion) | | |
|---|---|---|---|---|---|---|---|---|---|
| Line: | $SL_0$ | $\overline{SL}_0$ | $SX_0$ | $SL_1$ | $\overline{SL}_1$ | $SX_1$ | $SL_2$ | $\overline{SL}_2$ | $SX_2$ |
| Voltage: | GND | GND | $V_{DD}$ | $V_{search}$ | GND | GND | GND | $V_{search}$ | GND |

Since the bit-0 column is searched on the basis of the Y-criterion (wild card), none of the bit cells 110 in this column will be a miss regardless of what values are stored therein. Hence none of the bit cells 110 in the bit-0 column will pull down their respective match lines ML. In particular, the voltage of the node G in each bit cell 110 in the bit-0 column will be GND because $V_{DD}$ is applied to SX, which turns on the third switching transistor $T_3$ and connects the node G to the second rail ND (which is at GND during searching operations). Because $V_L$ is applied to the first rail NS, the gate-source voltage of the match-line transistor $T_4$ of each bit cell 110 in the bit-0 column will be $(-)V_L$, and hence the match-line transistor $T_4$ of each bit cell 110 in the bit-0 column will remain off.

The [bit-1, word-0] bit cell 110 stores a 1 and is searched on the basis of the 1 search criterion, and hence from equation 8 the voltage of node G becomes $$\frac{R_{LRS}}{R_{HRS} + R_{LRS}} V_{search},$$

which is a low value. Thus, the match-line transistor $T_4$ remains off and the [bit-1, word-0] bit cell 110 does not pull down its match line $ML_0$.

The [bit-2, word-0] bit cell 110 stores a 0, and is searched on the basis of the 0 search criterion, and hence from equation 5 the voltage of node G becomes $$\frac{R_{LRS}}{R_{LRS} + R_{HRS}} V_{search},$$

which is a low value. Thus, the match-line transistor $T_4$ remains off and the [bit-2, word-0] bit cell 110 does not pull down its match line $ML_0$.

Because none of the bit cells 110 in the word 0 pull down the match line $ML_0$, the row driver 151 determines that the word 0 is a match for the search word. Thus, an address of the word 0 is output from the row driver 151 as an output address.

The [bit-1, word-1] bit cell 110 stores a 0 and is searched on the basis of the 1 search criterion, and hence from equation 7 the voltage of node G becomes $$\frac{R_{HRS}}{R_{HRS} + R_{LRS}} V_{search},$$

which is a high value. Thus, the match-line transistor $T_4$ is turned on and the [bit-1, word-1] bit cell 110 pulls down its match line $ML_1$.

The [bit-2, word-1] bit cell 110 stores a 1 and is searched on the basis of the 0 search criterion, and hence from equation 6 the voltage of the node G becomes $$\frac{R_{HRS}}{R_{LRS} + R_{HRS}} V_{search},$$

which is a high value. Thus, the match-line transistor $T_4$ is turned on and the [bit-2, word-1] bit cell 110 pulls down its match line $ML_1$.

Because the [bit-1, word-1] bit cell 110 and the [bit-2, word-1] bit cell 110 both pull down the match line $ML_1$, the row driver 151 determines that the word 1 is a miss for the search word. Thus, an address of the word 1 is not output from the row driver 151 as an output address.

The [bit-1, word-2] bit cell 110 stores an X and is searched on the basis of the 1 search criterion, and hence from equation 9 the voltage of node G becomes $\tfrac{1}{2} V_{search}$, which is less than $V_{th} + V_L$. Thus, the match-line transistor $T_4$ is kept off and the [bit-1, word-2] bit cell 110 does not pull down its match line $ML_2$. (Note that this same result would have occurred if the bit cell 110 had been searched on the basis of the 0 search criterion).

The state of the [bit-2, word-2] bit cell 110 is similar to the state of the [bit-2, word-0] bit cell 110 that was described above, and hence the [bit-2, word-2] bit cell 110 does not pull down the match line $ML_2$.

Because none of the bit cells 110 in the word 2 pull down the match line $ML_2$, the row driver 151 determines that the word 2 is a match for the search word. Thus, an address of the word 2 is output from the row driver 151 as an output address.

Thus, in this example, in response to receiving "Y10" as an input search word and a control signal Ctrl indicating that a search is to be performed, the example TCAM 100 outputs the addresses of the word 0 and the word 2, both of which store words that match the input search word.

[Example Devices with TCAMs]

The example TCAMs described herein may be used in any electronic device in which a memory might be useful, such as, for example, in a personal computer, server, smartphone, tablet, network device, etc. In particular, the example TCAMs can be used to store data for the device by writing the data into the TCAM, and the device can access the stored data by reading from the TCAM. Moreover, the example TCAMs may also allow the device to search the TCAM based on an input search word, which can be particularly useful in a variety of applications. For example, a database application executed by an example device may benefit greatly by the device using the example TCAMs. As another example, a network device (such as a router, switch, gateway, etc.) may greatly benefit from using the example TCAMs, as the high search speed provided by the TCAM may allow the network device to operate at higher speeds than may otherwise be possible.

Figure 8:
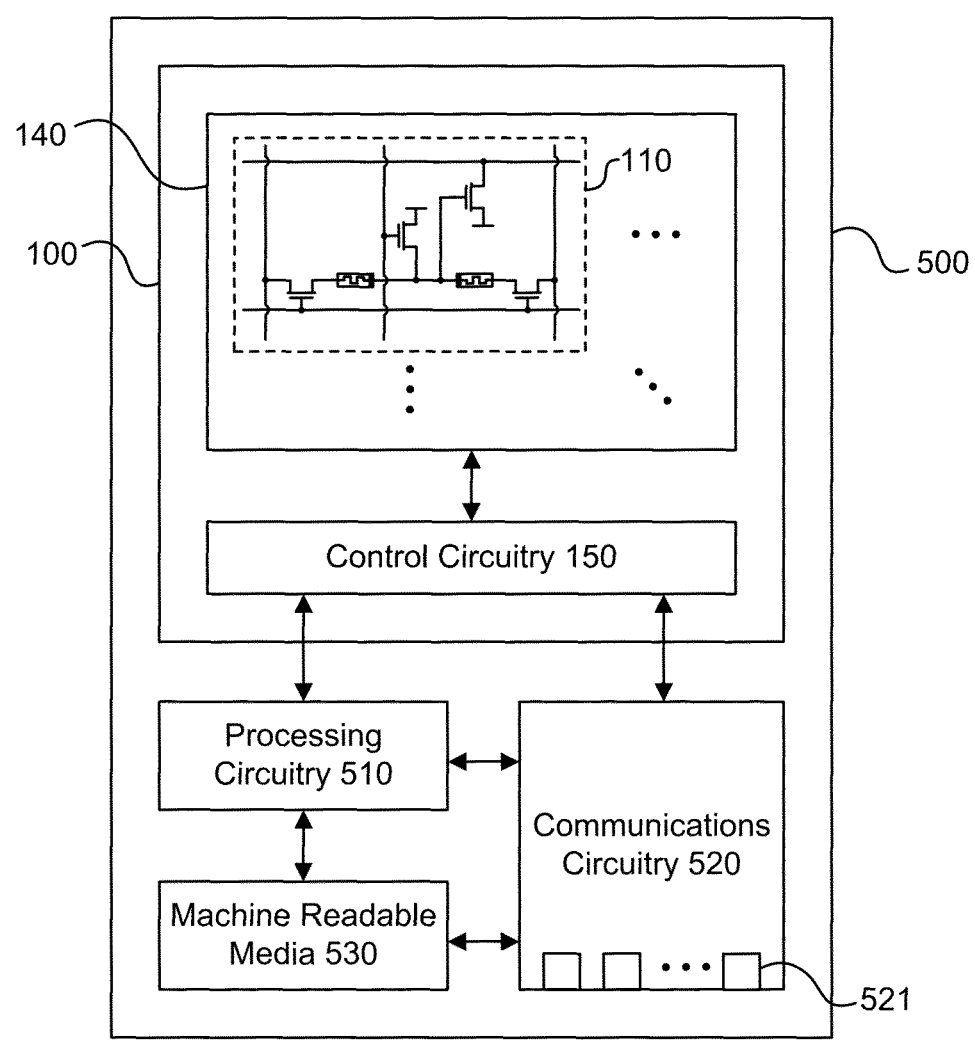
FIG. 8 is a diagram illustrating an example device that includes an example CAM as a component thereof.

FIG. 8 illustrates an example device 500 that includes an example TCAM 100. For ease of explanation, certain aspects of the example device 500 will be described below with the assumption that the example device 500 operates as a network device, but it should be understood that the example device 500 could be any type of electronic device. Moreover, some of the features described below could be omitted from the example device 500 and others not described below could be added.

The device 500 may include a TCAM 100, processing circuitry 510, communications circuitry 520, and machine readable media 530. The TCAM 100 may be an instance of the example TCAM 100 described above, and may include an array 140 of bit cells 110 and control circuitry 150.

The processing circuitry 510 may supply the control signal Ctrl to the control circuitry 150. The processing circuitry 510 may also supply the input word and the read/write address to the control circuitry 150. The processing circuitry 510 may be any circuitry capable of executing machine-readable instructions, such as a central processing unit (CPU), a microprocessor, a microcontroller device, a digital signal processor (DSP), etc. The processing circuitry 510 may also be an application-specific integrated circuit (ASIC), a field-programmable gate array (FPGA), an application-specific instruction set processor (ASIP), or the like, that is configured to perform certain operations described herein, such as the read, write, and search operations.

The machine readable media 530 may be any non-transitory machine readable medium, which may include volatile storage media (e.g., DRAM, SRAM, etc.) and/or non-volatile storage media (e.g., PROM, EPROM, EEPROM, NVRAM, hard drives, optical disks, etc.). The machine readable media 530 may store machine-readable instructions that, when executed by the processing circuitry 510, cause the device 500 to perform some or all of the operations described herein, such as the read, write, and search operations.

The communications circuitry 520 may be circuitry for receiving input data communications and sending output data communications. For example, the communications circuitry 520 may include a network interface card. In certain examples, the communications circuitry 520 may include multiple communications ports 521, and may serve to connect multiple other electronic devices to one another via the device 500. For example, the device 500 may be a network router, network switch, network gateway, or the like, and may perform various traffic control tasks such as routing, switching, etc. In certain examples, the communications circuitry 520 may receive communications that include a destination address (such as an IP address), and the communications circuitry 520 may determine which communications port 521 to forward the received communication to based on the destination address.

In particular, the communications circuitry 520 may determine which port 521 to forward a received communication to by searching the TCAM 100 based on the destination address that was included in the communication. For example, each device that is connected to the device 500 may have a unique device address (such as an IP address), and the device 500 may store the device address of each device that is connected thereto in the TCAM 100 such that the location of the stored device address within the TCAM 100 corresponds to the communications port 521 to which the device is connected. In particular, each word storage block of the TCAM 100 may correspond to a different port 521 of the device 500, and whenever a new device is connected to the device 500 the device address of the new device may be written into a word storage block that corresponds to the port 521 to which the new device is connected. Subsequently, when a communication is received by the communication circuitry 520, the destination address of the communication may be sent to the TCAM 100 (either directly, or via the processing circuitry 510) as an input search word; the TCAM 100 may then return a memory address of a matching word storage block to the communications circuitry 520 (either directly or via the processing circuitry 510). Because each word storage block in this example corresponds to a particular port 521, the memory address of the word storage block may be understood by the communications circuitry 520 to identity a particular port 521, and therefore the communications circuitry 520 can determine which port 521 to forward the communication to based on the output address of the TCAM 100. In certain examples, the memory address of each word storage block may be the same as the address of one of the ports 521, which may enable the communications circuitry 520 to easily determine from an output memory address which port 521 corresponds thereto.

In such an example, the TCAM 100 may operate as a look-up table that indicates which port corresponds to which destination address. However, because the entire array 140 of the TCAM 100 may be searched simultaneously and may be searched at the hardware level, the amount of time it takes for the device 500 to determine which port to forward a communication to can be greatly reduced.

In certain examples described above, the example memristors $M_1$ and $M_2$ are bipolar memristors—i.e., each is set by a setting voltage difference/current having one polarity and reset by a resetting voltage difference/current having a different polarity. However, in other examples the memristors $M_1$ and $M_2$ may each be a unipolar memristor—i.e., a memristor that is set and reset by setting and resetting voltage differences that have the same polarity. In examples that use unipolar memristors, the same reading and searching operations that were described above with regard to a bipolar memristor could be used, and any known unipolar memristor writing method could be used in place of the writing method described above.

In the description above, the memory elements of the bit cell 110 are described as memristors. In the art, the term "memristor" may be used in certain contexts in a broad sense and may be used in certain contexts in a narrow sense. In a narrow sense, "memristor" may refer specifically to circuit elements that exhibit a non-linear relationship between electric charge and magnetic flux (or exhibit a relationship between the time integral of current and the time integral of voltage). In a broad sense, "memristor" refers broadly to any non-volatile memory element that is based on changing resistance states and is read by its resistance. Herein and in the appended claims, "memristor" is always used in the broad sense, unless specifically indicated otherwise; specifically, as used herein, "memristor" refers broadly to any non-volatile memory element that is based on changing resistance states and is read by its resistance. Thus, the memristors $M_1$ and $M_2$ may each be, for example, a memristor in the narrow sense of the term, a memory element that changes the resistance across a dielectric solid-state material, a resistive random-access memory element (sometimes referred to as RRAM or ReRAM), a phase-change memory element (sometimes referred to as PCM or PCRAM), a conductive-bridging memory element (sometimes referred to as CBRAM or a programmable metallization cell), a magnetoresistive memory element (sometimes referred to as MRAM), or the like.

The example TCAMs are described herein and illustrated in the drawings in a conceptual or schematic manner to aid understanding. In particular, physical structures in the example TCAMs are referred to and/or illustrated conceptually herein as circuit components, and the relationships between these circuit components are illustrated in circuit diagrams in accordance with the usual practice in the art. Circuit components are conceptual representations of classes of physical structures or devices that perform certain functions and/or have certain properties. Examples of such circuit components include passive devices such as resistors, capacitors, memristors, etc.; active devices such as transistors, diodes, etc.; constituent elements of the active/passive devices such as terminals, electrodes, gates, sources, drains, etc.; elements that connect devices such as wiring lines, nodes, etc.; and so on. It should be understood that a single physical structure (or set of physical structures) in an actual physical incarnation of an example TCAM may serve multiple functions and/or have multiple properties, and thus a single physical structure (or set of physical structures) may be described and/or illustrated herein as multiple distinct circuit components. For example, a single piece of metal in a particular physical incarnation of an example TCAM may serve as both a gate electrode of a transistor and as a wiring line. Thus, the fact that two or more circuit components may be referred to or illustrated herein as distinct components should not be interpreted to mean that their corresponding physical structures in a physical incarnation of the example TCAM are distinct structures.

When reference is made herein or in the appended claims to a first circuit component being "connected to" a second circuit component, this means that: (1) the physical structures corresponding to the first and second components are so arranged that a current path exists therebetween, and/or (2) a single physical structure that is electrically conductive serves as at least a part of both the first and second circuit components. Note that, in light of this definition, a reference herein to or illustration in the drawings of multiple circuit components being "connected to" one another does not imply that the circuit components are necessarily separate physical entities. For example, a reference to a first circuit component being "connected to" a second circuit component could encompass: (A) a scenario in which a physical structure that serves as a terminal of the first circuit component is in direct physical contact with a physical structure that serves as a terminal of the second circuit; (B) a scenario in which a physical structure that serves as a terminal of the first circuit component is in direct physical contact with an electrical conductor (e.g., a wiring line) that is itself in direct physical contact with a physical structure that serves as a terminal of the second circuit; (C) a scenario in which the same physical structure that serves as a terminal of the first circuit component also serves as a terminal of the second circuit component; etc.

When reference is made herein or in the appended claims to a first component being "connected between" second and third component, this means that two opposing terminals of the first component are connected to the second component and to the third component, respectively. In particular, when reference is made herein or in the appended claims to a transistor being "connected between" two elements, this means that a source terminal of the transistor (also referred to as a source electrode, source region, source, etc.) is connected to one of the two elements, and a drain terminal of the transistor (also referred to as a drain electrode, drain region, drain, etc.) is connected to the other one of the two elements.

When reference is made herein or in the appended claims to a number of circuit components being "connected in series between" a first element and a second element, this means that the number of circuit components are connected end-to-end in a series, in the same order that they are recited, and that the first circuit component of the series is connected to the first element and the last circuit component of the series is connected to the second element. For example, "A, B, and C are connected in series between D and E" means that D is connected to A, A is connected to B, B is connected to C, and C is connected to E, which may be graphically represented as D-{A-B-C}-E where the dashes ("-") indicate connections and the braces ("{ }") indicate the series.

When reference is made herein or in the appended claims to a first circuit component being "switchably connected to" a second circuit component, this means that a switch is interposed between the first and second circuit components such that the first circuit component is "connected to" the second component when the switch is closed and is not "connected to" the second component when the switch is open. In this context, a switch is any device that can selectively connect or disconnect the first and second circuit elements to/from each other. For example, the switch may be a transistor, a multiplexor, a demultiplexor, a mechanical switch, etc. When a transistor is the switch, the switch is closed when the transistor is on (i.e., ohmic, i.e., a channel has formed), and the switch is open when the transistor is off (i.e., not ohmic, i.e., no channel has formed).

As used herein, applying a given voltage difference "across" a circuit component (such as the memristor M) means applying voltages to two terminals of the circuit component such that the larger of the applied voltages minus the smaller of the applied voltages equals the given voltage difference. A polarity with which the voltage difference is applied across the circuit component corresponds to the direction in which current would tend to flow through the circuit component (if allowed to do so) as a result of the applied voltage difference, which will depend upon which terminal of the circuit component has the larger of the applied voltages. In particular, when the given voltage difference is applied across the circuit component by applying the larger of the applied voltages to a first terminal of the circuit component and the smaller of the applied voltages to a second terminal of the circuit component, this may be referred to as applying the given voltage difference with a first polarity; when the given voltage difference is applied across the circuit component by applying the larger of the applied voltages to the second terminal and the smaller of the applied voltages to a first terminal, this may be referred to as applying the given voltage difference with a second polarity.

References herein to a resistance $R_{LRS}$ that is associated with a low resistance state of the memristor $M_1$ or $M_2$ should not be interpreted to imply that each memristor $M_1$ or $M_2$ is set precisely to the value $R_{LRS}$ each time they are set to the low resistance state. In certain examples, the low resistance state of the memristor $M_1$ or $M_2$ might encompass a range of resistance values rather than just one specific resistance value. In particular, the resistance of the memristor $M_1$ or $M_2$ is not necessarily the exact same value each time that the memristor $M_1$ or $M_2$ is set to the low resistance state. This may occur, for example, as a result of inevitable manufacturing variances between memristors $M_1$ or $M_2$ as well as inventible variances in the voltages that are applied for setting/resetting operations. Instead, the resistance $R_{LRS}$ is a particular resistance value that is associated with the range of resistance values that comprises the low resistance state of the memristor $M_1$ or $M_2$.

Similarly, references herein to a resistance $R_{HRS}$ that is associated with a high resistance state of the memristor $M_1$ or $M_2$ should not be interpreted to imply that each memristor $M_1$ or $M_2$ is set precisely to the value $R_{HRS}$ each time they are reset to the high resistance state. In certain examples, the high resistance state of the memristor M might encompass a range of resistance values rather than just one specific resistance value. In particular, the resistance of the memristor $M_1$ or $M_2$ is not necessarily the exact same value each time that the memristor $M_1$ or $M_2$ is reset to the high resistance state. Instead, the resistance $R_{HRS}$ is a particular resistance value that is associated with the range of resistance values that comprises the high resistance state of the memristor $M_1$ or $M_2$.

The resistances $R_{LRS}$ and $R_{HRS}$ may be determined by a variety of methods. For example, a range of resistance values for the low resistance state and a range of resistance values for the high resistance state may be determined by repeatedly setting and resetting the memristor $M_1$ or $M_2$ and measuring its resistance each time and determining the ranges of values based on these measurements, and then the resistances $R_{LRS}$ and $R_{HRS}$ may be determined to be particular values within their corresponding ranges. For example, the resistance $R_{LRS}$ may be the highest value of the range of low resistance state values and the resistance $R_{HRS}$ may be the lowest value of the range of high resistance state values. In certain examples, the resistances $R_{LRS}$ and $R_{HRS}$ may be determined to be statistical aggregations of measured resistance values of the memristor $M_1$ or $M_2$ (or of multiple memristors $M_1$ or $M_2$) in the set and reset states, respectively; for example, $R_{LRS}$ and $R_{HRS}$ may be determined to be the average, the median, the mode, etc., of their respectively corresponding measured resistance values. In certain examples, the memristor(s) $M_1$ or $M_2$ may be repeatedly set and reset and their resistances measured, and $R_{LRS}$ and $R_{HRS}$ may be determined to be the lowest and the highest resistance values, respectively, that are measured in this process.

In the description above, the transistors of the bit cell were described as all being NFET transistors, but it should be understood that all PFET transistors could be used instead. In such a case, the voltages that result in the transistors turning on and off would be reversed (low gate-source voltage turning the PFET on and high gate-source voltage turning the PFET off), and therefore voltages applied during the search operations may be reversed to preserve the desired search results.

When describing the arrangements of circuit components and locations where voltages are applied to circuit components, references may be made to directions (e.g., "left", "right", etc.). These references should be understood to refer to directions in the circuit diagrams illustrated in the Figures. These references do not imply any sort of limitation with regard to the physical location of structures in a physical incarnation of an example TCAM. Moreover, references may be made to a "side" of a circuit component (e.g, "left side", "right side", etc.). These references should be understood to refer the terminal of the circuit component that corresponds to the identified side of the symbol that represents the circuit component in the circuit diagrams. These references do not imply any sort of limitation with regard to the orientation or location of structures corresponding to the circuit component in a physical incarnation of an example TCAM. Thus, for example, a reference to a voltage being applied to the "left side" of the memristor $M_1$ means that the voltage is applied to the terminal of the memristor $M_1$ that is connected to the transistor $T_1$, because in FIG. 1 the left side of the symbol that represents the memristor $M_1$ corresponds to the terminal that is connected to the transistor $T_1$.

Throughout this disclosure and in the appended claims, occasionally reference may be made to "a number" of items. Such references to "a number" mean any integer greater than or equal to one. When "a number" is used in this way, the word describing the item(s) may be written with the pluralized "s" for grammatical consistency, but this does not necessarily mean that multiple items are being referred to. Thus, for example, "a number of comparators" could encompass both one comparator and multiple comparators.

While the above disclosure has been shown and described with reference to the foregoing examples, it should be understood that other forms, details, and implementations may be made without departing from the spirit and scope of this disclosure.

What is claimed is:

1. A ternary content addressable memory comprising:
   a bit cell that includes:
      first and second memristors, wherein a first terminal of the first memristor is connected to a first terminal of the second memristor via a node, a second terminal of the first memristor is switchably connected to a first data line, and a second terminal of the second memristor is switchably connected to a second data line; and
      a match-line transistor that is connected between a first rail and a match line, wherein a gate of the match-line transistor is connected to the node; and
   control circuitry to write to the bit cell, read from the bit cell, and search the bit cell,
   the control circuitry is to search the bit cell on the basis of a first search criterion associated with a first binary value by applying a first voltage to the first data line and a second voltage to the second data line, search the bit cell on the basis of a second search criterion associated with a second binary value by applying the second voltage to the first data line and the first voltage to the second data line, and search the bit cell based on a wildcard search criterion by applying the first voltage to the node.

2. The ternary content addressable memory of claim 1, wherein the node is switchably connected to a second rail, and
   the control circuitry is to apply the first voltage to the node via the second rail while searching the bit cell based on the wildcard search criterion.

3. The ternary content addressable memory of claim 1, wherein the bit cell is to keep its match-line transistor off while being searched if:
   the bit cell stores the first binary value and is searched on the basis of the first search criterion; and
   the bit cell stores the second binary value and is searched on the basis of the second search criterion;
   the bit cell stores the wildcard value and is searched on the basis of any one of the first, second, and wildcard search criteria;
   the bit cell stores any one of the first binary value, the second binary value, and the wildcard value and is searched on the basis of the wildcard search criterion.

4. The ternary content addressable memory of claim 1, wherein, while the bit cell is being searched, the control circuitry is to apply a third voltage to the first rail such that the match-line transistor is off when a voltage of the node is half of a difference between the second voltage and the first voltage.

5. The ternary content addressable memory of claim 1, further comprising:
   a first switching transistor connected between a first data line and a second terminal of the first memristor;
   a second switching transistor connected between a second data line and a second terminal of the second memristor; and a third switching transistor that is connected between the node and a second rail and has a gate that is connected to a third data line, wherein a gate of the first switching transistor and a gate of the second switching transistor are connected to a word line.

6. The ternary content addressable memory of claim 5, wherein the first, second, and third switching transistors and the match-line transistor are all a same channel type as one another.

7. The ternary content addressable memory of claim 1, wherein the bit cell is to store the first binary value by causing a first memristor of the memristors to enter a high resistance state and a second memristor of the memristors to enter a low resistance state, the bit cell is to store the second binary value by causing the first memristor to enter the low resistance state and the second memristor to enter the high resistance state, and the bit cell is to store a wildcard value by causing the first memristor and the second memristor to both enter the low resistance state or to both enter the high resistance state.

8. The ternary content addressable memory of claim 7, wherein during a search, a voltage of the node causes the match-line transistor to turn on when a value stored in the bit cell misses a search criterion of the search.

9. The ternary content addressable memory of claim 7, wherein the first memristor and the second memristor are caused to enter the high resistance state by connecting the node to a reset voltage while a second terminal of the first memristor or a second terminal of the second memristor, respectively, is connected to a ground voltage, and the first memristor and the second memristor are caused to enter the low resistance state by connecting the node to the ground voltage while the second terminal of the first memristor or the second terminal of the second memristor, respectively, is connected to a set voltage.

10. The ternary content addressable memory of claim 9, further comprising:

a switching transistor that is to selectively connect the node to a second rail that is to carry the reset voltage and the ground voltage.

11. A ternary content addressable memory comprising:

a bit cell that includes:
  two memristors that are connected to each other so as to form a resistive divider that has a first input terminal that is switchably connected to a first data line and a second input terminal that is switchably connected to a second data line, and
  a match-line transistor that switchably connects a match line to a first rail, wherein a voltage of an output terminal of the resistive divider controls a conductive state of the match-line transistor, the bit cell is to store a first binary value by causing a first memristor of the memristors to enter a high resistance state and a second memristor of the memristors to enter a low resistance state, the bit cell is to store a second binary value by causing the first memristor to enter the low resistance state and the second memristor to enter the high resistance state, and the bit cell is to store a wildcard value by causing the first memristor and the second memristor to both enter the low resistance state or to both enter the high resistance state.

12. The ternary content addressable memory of claim 11, wherein the bit cell is to be searched based on a first search criterion associated with the first binary value, a second search criterion associated with the second binary value, and a wildcard search criterion, and during a search, the voltage of the output terminal of the resistive divider causes the match-line transistor to turn on when a value stored in the bit cell misses a search criterion of the search.

13. The ternary content addressable memory of claim 11, further comprising:

control circuitry to write to the bit cell, read from the bit cell, and search the bit cell, by supplying voltages to the bit cell, wherein the control circuitry is to search the bit cell on the basis of a first search criterion associated with the first binary value by applying a first voltage the first terminal of the resistive divider and a second voltage to the second terminal of the resistive divider, and search the bit cell on the basis of a second search criterion associated with the second binary value by applying the second voltage to the first terminal of the resistive divider and the first voltage to the second terminal of the resistive divider, and search the bit cell based on a wildcard search criterion by applying the first voltage to an output terminal of the resistive divider.

14. The ternary content addressable memory of claim 13, wherein, while the bit cell is being searched, the control circuitry is to apply a third voltage to the first rail such that the match-line transistor is off when the voltage of the output terminal of the resistive divider is half of a difference between the second voltage and the first voltage.

15. An electronic device, comprising:

a ternary content addressable memory (TCAM) that comprises:
  a plurality of bit cells that each include
    a first memristor and a second memristor that are connected to each other so as to form a resistive divider that has a first input terminal that is switchably connected to a first data line and a second input terminal that is switchably connected to a second data line, and
    a match-line transistor that switchably connects a corresponding match line to a first rail; and
  control circuitry that is to store data words in word blocks that respectively comprise word-sized subsets of the plurality of bit cells and to search the plurality of bit cells for stored words, wherein the control circuitry is to:
  store a first binary value in any one of the plurality of bit cells by causing the first memristor thereof to enter a high resistance state and the second memristor thereof to enter a low resistance state,
  store a second binary value in any one of the plurality of bit cells by causing the first memristor thereof to enter the low resistance state and the second memristor thereof to enter the high resistance state, and
  store a wildcard value in any one of the plurality of bit cells by causing the first memristor and the second memristor thereof to both enter the low resistance state or to both enter the high resistance state.

16. The electronic device of claim 15,
wherein the TCAM comprises a plurality of match lines that each correspond to one of the word blocks, and
the control circuitry is to simultaneously search all of the plurality of bit cells for a given word by pre-charging the plurality of match lines, applying voltage differences across the respective resistive dividers of the plurality of bit cells based on the given word, and identifying as a match any word block whose corresponding match line does not have its voltage pulled down.

17. The electronic device of claim 16,
wherein for each of the plurality of bit cells, whether the respective bit cell causes its corresponding match line to be pulled down during the searching depends on a voltage of an output terminal of the resistive divider of the respective bit cell.

18. The electronic device of claim 16,
wherein, for each of the plurality of bit cells, a gate of the match-line transistor is connected to the output terminal of the resistive divider of the respective bit cell.

19. The device of claim 15,
wherein the control circuitry is to
search any one of the plurality of bit cells on the basis of a first search criterion associated with the first binary value by applying a first voltage to the corresponding first data line and a second voltage to the corresponding second data line,
search any one of the plurality of bit cells on the basis of a second search criterion associated with the second binary value by applying the second voltage to the corresponding first data line and the first voltage to the corresponding second data line, and
search any one of the plurality of bit cells based on a wildcard search criterion by applying the first voltage to an output terminal of the resistive divider of the respective bit cell.

20. The device of claim 19,
wherein, for each of the plurality of bits cells, the respective bit cell is to keep its match-line transistor off while being searched if:
the respective bit cell stores the first binary value and is searched on the basis of the first search criterion; and
the respective bit cell stores the second binary value and is searched on the basis of the second search criterion;
the respective bit cell stores the wildcard value and is searched on the basis of any one of the first, second, and wildcard search criteria;
the respective bit cell stores any one of the first binary value, the second binary value, and the wildcard value and is searched on the basis of the wildcard search criterion.

\* \* \* \* \*